United States Patent
Itonaga

(10) Patent No.: US 8,957,357 B2
(45) Date of Patent: Feb. 17, 2015

(54) SOLID-STATE IMAGING DEVICE, MANUFACTURING METHOD OF THE SAME, AND ELECTRONIC APPARATUS

(75) Inventor: Kazuichiro Itonaga, Tokyo (JP)

(73) Assignee: Sony Corporation, Tokyo (JP)

( * ) Notice: Subject to any disclaimer, the term of this patent is extended or adjusted under 35 U.S.C. 154(b) by 766 days.

(21) Appl. No.: 12/728,514

(22) Filed: Mar. 22, 2010

(65) Prior Publication Data

US 2010/0243864 A1    Sep. 30, 2010

(30) Foreign Application Priority Data

Mar. 31, 2009    (JP) .................... 2009-088095

(51) Int. Cl.
H01L 27/146 (2006.01)
H01L 31/10 (2006.01)
H01L 31/103 (2006.01)

(52) U.S. Cl.
CPC ........ *H01L 31/103* (2013.01); *H01L 27/14609* (2013.01); *H01L 27/14643* (2013.01); *H01L 27/14689* (2013.01); *H01L 27/14621* (2013.01); *H01L 27/14627* (2013.01)
USPC ............... 250/208.1; 257/292; 257/E31.053; 257/E27.133; 438/308

(58) Field of Classification Search
USPC ........ 250/208.1; 348/308; 257/288, 291, 292, 257/431, 443, 445, 461, 463, E31.053, 257/E31.054, E27.133, E27.139
See application file for complete search history.

(56) References Cited

U.S. PATENT DOCUMENTS

| | | | | |
|---|---|---|---|---|
| 4,142,200 | A * | 2/1979 | Mizushima et al. | 257/438 |
| 5,898,195 | A * | 4/1999 | Harada | 257/223 |
| 5,903,021 | A * | 5/1999 | Lee et al. | 257/292 |
| 6,271,554 | B1 * | 8/2001 | Nozaki et al. | 257/292 |
| 6,287,886 | B1 * | 9/2001 | Pan | 438/57 |
| 6,949,809 | B2 * | 9/2005 | Takimoto et al. | 257/463 |
| 7,034,347 | B2 * | 4/2006 | Kuriyama | 257/292 |
| 7,115,924 | B1 * | 10/2006 | LaMaster et al. | 257/291 |
| 7,205,627 | B2 * | 4/2007 | Adkisson et al. | 257/463 |
| 7,329,557 | B2 * | 2/2008 | Mimuro et al. | 438/78 |
| 7,402,479 | B2 * | 7/2008 | Lim | 438/200 |
| 7,535,073 | B2 * | 5/2009 | Ezaki | 257/440 |
| 7,554,170 | B2 * | 6/2009 | Raynor | 257/444 |
| 7,557,397 | B2 * | 7/2009 | Palsule et al. | 257/292 |
| 7,586,172 | B2 * | 9/2009 | Roy | 257/462 |
| 7,701,030 | B2 * | 4/2010 | Roy | 257/463 |
| 7,821,093 | B2 * | 10/2010 | Kitano et al. | 257/461 |

(Continued)

FOREIGN PATENT DOCUMENTS

| JP | A HEI 11-040794 | 2/1999 |
|---|---|---|
| JP | 11-274457 | 10/1999 |

(Continued)

OTHER PUBLICATIONS

Japanese Patent Office; Office Action dated Aug. 6, 2013; Serial No. 2009-088095.

(Continued)

*Primary Examiner* — John Lee
(74) *Attorney, Agent, or Firm* — Dentons US LLP

(57) ABSTRACT

A solid-state imaging device includes plural photodiodes which are formed in a photodiode area of a unit pixel with no element separating area interposed therebetween and in which impurity concentrations of pn junction areas are different from each other.

10 Claims, 11 Drawing Sheets

(56) References Cited

U.S. PATENT DOCUMENTS

| | | | |
|---|---|---|---|
| 7,863,701 B2 * | 1/2011 | Iwai | 257/431 |
| 7,898,010 B2 * | 3/2011 | Mouli et al. | 257/292 |
| 8,080,857 B2 * | 12/2011 | Tomita | 257/461 |
| 2006/0244090 A1 * | 11/2006 | Roy et al. | 257/462 |
| 2006/0275990 A1 * | 12/2006 | Itonaga | 438/286 |
| 2008/0272455 A1 * | 11/2008 | Inoue | 257/445 |
| 2009/0134436 A1 * | 5/2009 | Nagano et al. | 257/291 |
| 2010/0243864 A1 * | 9/2010 | Itonaga | 250/208.1 |
| 2011/0089497 A1 * | 4/2011 | Fukutome | 257/371 |
| 2011/0226936 A1 * | 9/2011 | Pain et al. | 250/214.1 |

FOREIGN PATENT DOCUMENTS

| | | |
|---|---|---|
| JP | A HEI 11-274450 | 10/1999 |
| JP | 2003-096421 | 11/2003 |
| JP | A HEI 2005-072236 | 3/2005 |
| JP | A 2005-123395 | 5/2005 |
| JP | A 2005-322932 | 11/2005 |
| JP | A 2006-186262 | 7/2006 |
| JP | A 2006-191034 | 7/2006 |
| JP | T 2007-503722 | 2/2007 |
| JP | 2008-021925 | 1/2008 |
| JP | 2008-166607 | 7/2008 |
| JP | A 2009-158932 | 7/2009 |

OTHER PUBLICATIONS

Text of the Fifth Office Action; State Intellectual Property Office of the People's Republic of China; Application No. 201010140801.x; Dated Dec. 2, 2013; pp. 1-8.

* cited by examiner

US 8,957,357 B2

SOLID-STATE IMAGING DEVICE, MANUFACTURING METHOD OF THE SAME, AND ELECTRONIC APPARATUS

BACKGROUND OF THE INVENTION

1. Field of the Invention

The present invention relates to a solid-state imaging device, a manufacturing method of the same, and an electronic apparatus such as a camera including the solid-state imaging device.

2. Description of the Related Art

As a solid-state imaging device, there is known an amplification type solid-state imaging device of which a representative example is an MOS image sensor such as a CMOS (Complementary Metal Oxide Semiconductor) image sensor. In addition, there is known a charge transfer type solid-state imaging device of which a representative example is a CCD (Charge Coupled Device) image sensor. These solid-state imaging devices are widely used in a digital still camera, a digital video camera, or the like. In recent years, as the solid-state imaging device mounted on a camera-attached cellular phone or PDA (Personal Digital Assistant), an MOS image sensor is widely used in terms of low power voltage, low power consumption, or the like.

In the MOS type solid-state imaging device, a unit pixel includes a photodiode serving as a photoelectric conversion unit and plural pixel transistors. The solid-state imaging device includes a pixel section (imaging area), where the plural unit pixels are arranged in a two-dimensional array shape, and a peripheral circuit area. The plural pixel transistors are formed as an MOS transistor and may include three transistors, that is, a transmission transistor, a reset transistor, an amplification transistor or four transistors in addition to a selection transistor.

FIG. 14 is a diagram illustrating the main elements of a charge reading unit of a pixel 102 in a general MOS solid-state imaging device 101 according to the related art. In the pixel 102, a p-type semiconductor well area 104 is formed on an n-type semiconductor substrate 103, for example. The p-type semiconductor well area 104 is provided with a photodiode 105 serving as a photoelectric conversion unit and a floating diffusion 108 formed as an n-type semiconductor area reading signal charges of the photodiode 5. A transmission transistor Tr1 is formed which includes a transmission gate electrode 111 formed with a gate insulating film 109 interposed between the photodiode 105 and the floating diffusion 108. A charge reading portion is formed in the transmission transistor.

The photodiode 105 is formed as a buried-type photodiode including an n-type semiconductor area 106 serving as a charge storage area which stores the signal charges and a p-type semiconductor area 107 also serving as a hole accumulation layer formed in the interface of the surface of the n-type semiconductor area 106. The p-type semiconductor area 107 is referred to as a hole charge storage area. The hole charge storage area 107 functions as inhibiting a dark current and is formed in a relatively high concentration p+ area. The n-type semiconductor area 106 serving as a charge storage area is also formed in a relatively high concentration n+ area. A relatively low concentration n-type semiconductor area (n−− area) with a necessary depth is formed continuously below the n-type semiconductor area 106. A depth D1 refers to a distance between the substrate surface and the bottom of an n-type semiconductor area 110. The n−− area 100 and the n+ area 106 form an n-type area of the photodiode 5. A side wall 112 formed of a two-layered insulating film is formed on a side of the transmission gate electrode 111 of the transmission transistor Tr1.

In the photodiode 105, the n-type semiconductor area 106 serving as the charge storage area is formed so as to partially overlap with the transmission gate electrode 111, and the hole charge storage area 107 is formed in an offset state so as to be slightly distant from the transmission gate electrode 111. This is because a reading characteristic of the signal charges stored in the n-type semiconductor area 106 is made satisfactorily. For example, when the hole charge storage area 107 is formed close to the transmission gate electrode 111, it is difficult to modulate the potential of a portion close to the transmission gate of the n-type semiconductor area 107 upon reading the charges, and thus it is difficult to read the signal charges. This is because the potential of the hole charge storage area 107 is fixed to a reference potential. That is, when the hole charge storage area 107 is close to the gate electrode 111, a gate voltage (reading voltage) Vtg of the transmission transistor Tr1 is increased, and thus it is difficult to read the signal charges. By separating the hole charge storage area 107 from the gate electrode 111, the potential of the portion close to the transmission gate of the n-type semiconductor area 106 is modulated, thereby reading the signal charges of the photodiode 105 easily.

Japanese Unexamined Patent Application Publication No. 2008-21925 and PCT application No. WO2003/096421 disclose a solid-state imaging device in which a hold charge storage area in a photodiode is formed in the offset state so as to be separate from a gate electrode.

Japanese Unexamined Patent Application Publication No. 11-274457 discloses a solid-state imaging device in which an n-type semiconductor area serving as a charge storage area extends to a gate portion more than a p-type semiconductor area also serving as a hole charge storage area.

SUMMARY OF THE INVENTION

In the above-described MOS solid-state imaging device 101 shown in FIG. 14, since the hole charge storage area 107 in the photodiode 105 separates from the transmission gate electrode 111 by the distance of the side wall 112, the signal charges are easily read. That is, occurrence of an afterimage is inhibited. However, since the hole charge storage area 107 is formed in the offset state and is not formed just below the side wall 112, a white dot easily occurs due to upwelling of the charges (electrons) from the interface between the side wall 112 and the silicon surface. That is, when the occurrence of an afterimage is inhibited, a white dot easily occurs. On the contrary, when the occurrence of a white dot is inhibited, an afterimage easily occurs. Therefore, an afterimage and a white dot have a tradeoff relationship.

In FIG. 14, the buried-type photodiode 105 according to the related art is formed by self-alignment. First, the transmission gate electrode 111 is formed, the n-type semiconductor area 106 is formed by ion-implanting, the side wall 112 is formed, and the hole charge storage area 107 is formed. On the other hand, boron of weak concentration is implanted using a mask with a voltage Vth which is the minimum physical amount inducing a reaction to a channel area.

Since the boron is implanted using the mask, this may increase a difference between the profiles of the impurity concentrations in the vicinity of the edge of the transmission gate, a difference in the reading characteristic of the signal charges, or a difference in a storing and maintaining characteristic of the signal charges.

When the n-type semiconductor area 106 serving as the charge storage area is formed, as shown in FIG. 15, a depth D2 of a range distance (peak position of a concentration distribution) Rp in the ion-implanting according to the related art is set to be larger than a thickness D3 of the transmission gate electrode 111 including the gate insulating film (D2>D3). This is because when the n-type semiconductor area 106 is formed shallowly, the n-type semiconductor area 106 overlaps with the hole charge storage area 107 close to the surface and the range distance Rp is set deep so that the concentration of the hole charge storage area 107 or the concentration of the n-type semiconductor area 106 becomes weak.

The ion-implanting performed upon forming the n-type semiconductor area 106 is performed by covering other areas with a resist mask 114 so that the n-type semiconductor area 106 partially overlaps with the transmission gate electrode 111. From the relationship between the thickness D3 of the transmission gate electrode 111 and the depth D2 of the range distance Rp in the ion implanting, n-type impurities 115 pass through the transmission gate electrode 111, when the n-type impurities 115 are implanted by the self-alignment. For this reason, a dense concentration n-type area is formed on the channel surface just below the transmission gate electrode. In order to prevent this problem, as shown in FIG. 16, a resist mask 116 used in patterning the transmission gate electrode 111 remains. The resist mask 114 is formed on the resist mask 116 and the n-type impurities 115 are implanted using the double resist films in a certain case.

In recent years, however, a pixel has been miniaturized and the thickness of the gate electrode has become thinner. That is, the thickness of the gate electrode becomes thinner in order to perform minute patterning and the thickness of a resist film becomes thinner. For this reason, it is difficult to ion-implant n-type impurities using the above-described resist film and thus it is difficult to form a photodiode by the self-alignment. When a pixel is miniaturized, a slight difference in size may result in a difference in characteristics.

It is desirable to provide a solid-state imaging device and a manufacturing method of the same capable of forming a pixel by self-alignment even when the pixel is miniaturized and capable of inhibiting both occurrence of an afterimage and occurrence of a white dot to improve a reading characteristic.

It is desirable to provide an electronic apparatus including the solid-state imaging device.

A solid-state imaging device according to an embodiment of the invention includes plural photodiodes which are formed in a photodiode area of a unit pixel with no element separating area interposed therebetween and in which impurity concentrations of pn junction areas are different from each other.

Since the solid-state imaging device according to an embodiment of the invention includes the plural photodiodes, in which the impurity concentrations of the pn junction area are different from each other, in the photodiode area of the unit pixel, the magnitude of an electric field is relaxed by the low impurity concentration photodiode close to the transmission gate electrode. Due to the relaxation of the magnitude of the electric field, it is easy to modulate the potential below the vicinity of the end of the transmission gate electrode in the photodiode, thereby reading the signal charges easily, when a reading voltage is applied to the transmission gate electrode. Below the side wall of the transmission gate electrode, upwelling of charges from a substrate interface is inhibited by the semiconductor area where the pn junction of the low impurity concentration photodiodes is formed. The plural photodiodes can be formed by the self-alignment by ion-implanting using the transmission gate electrode or/and the side wall as a mask.

A method of manufacturing a solid-state imaging device according to an embodiment of the invention includes the step of, in an area where photodiodes of a unit pixel are formed, forming a second conductive type semiconductor area of a substrate surface and forming a first conductive type semiconductor area deeper than the second conductive type semiconductor area by ion-implanting impurities using the transmission gate electrode as a mask. This step is a step of forming a buried-type second photodiode. Subsequently, the method of manufacturing the solid-state imaging device includes the step of forming a side wall in the transmission gate electrode and forming a second conductive type semiconductor area of the substrate surface, where an impurity concentration is increased, and a first conductive type semiconductor area deeper than the second conductive type semiconductor area by ion-implanting impurities using the transmission gate electrode and the side wall as a mask. This step is a step of forming a buried-type first photodiode.

In the method of manufacturing the solid-state imaging device according to an embodiment of the invention, the second photodiode may be formed by ion-implanting impurities using the transmission gate electrode as a mask. Subsequently, the side well is formed on the side of the transmission gate electrode, and then the first photodiode is formed by ion-implanting impurities using the side wall and the transmission gate electrode as a mask. In the steps, the second photodiode having the low impurity concentration pn function area just below the side wall is formed by the self-alignment. In addition, the first photodiode having the high impurity concentration pn junction area outside the end edge of the side wall is formed by the self-alignment.

A method of manufacturing a solid-state imaging device according to an embodiment of the invention includes the step of, in an area where photodiodes of a unit pixel are formed, forming the photodiodes, which are formed with no element separating area interposed therebetween and in which impurity concentrations of pn junction areas are different from each other. In this step, ion-implanting is performed in plural stages including ion implanting and vertical ion implanting are performed using a transmission gate electrode and/or a side wall of the transmission gate electrode as a mask.

In the method of manufacturing the solid-state imaging device according to an embodiment of the invention, the ion-implanting is performed in plural stages including the tilt ion implanting and the vertical ion implanting are performed using the transmission gate electrode and/or the side wall of the transmission gate electrode as a mask. In this step, the plural photodiodes are formed by the self-alignment such that the impurity concentrations are lowered toward the transmission gate electrode in an area below a part of the transmission gate electrode, an area below the side wall, and an area outside the side wall.

An electronic apparatus according to an embodiment of the invention includes: a solid-state imaging device; an optical system guiding incident light to plural photodiodes of the solid-state imaging device; and a signal processing circuit which processes an output signal of the solid-state imaging device. The solid-state imaging device has the photodiodes which are formed in a photodiode area of a unit pixel with no element separating area interposed therebetween and in which impurity concentrations of pn junction areas are different from each other.

Since the electronic apparatus includes the solid-state imaging device according to an embodiment of the invention, the signal charges from the photodiodes are easily read and the occurrence of a white dot is inhibited.

The solid-state imaging device according to an embodiment of the invention is capable of inhibiting both the occurrence of an afterimage and the occurrence of a white dot to improve the reading characteristic, since a pixel is formed by the self-alignment, even when the pixel is miniaturized.

The method of manufacturing the solid-state imaging device according to an embodiment of the invention is capable of inhibiting both the occurrence of an afterimage and the occurrence of a white dot to improve the reading characteristic, since a pixel is formed by the self-alignment, even when the pixel is miniaturized.

Since the electronic apparatus according to an embodiment of the invention includes the solid-state imaging device according to an embodiment of the invention, both the occurrence of an afterimage and the occurrence of a white dot can be inhibited. Accordingly, it is possible to provide a high-quality electronic apparatus.

DESCRIPTION OF THE PREFERRED EMBODIMENTS

Hereinafter, preferred embodiments (hereinafter, referred to as embodiments) of the invention will be described. The description is made in the following order.

1. Exemplary Overall Configuration of MOS Solid-State Imaging device

2. First Embodiment (Exemplary Configuration of Solid-State Imaging device and Exemplary Manufacturing Method Of The Same)

3. Second Embodiment (Exemplary Configuration of Solid-State Imaging device)

4. Third Embodiment (Exemplary Configuration of Solid-State Imaging device)

5. Fourth Embodiment (Exemplary Configuration of Solid-State Imaging device and Exemplary Manufacturing Method Of The Same)

6. Fifth Embodiment (Exemplary Configuration of Solid-State Imaging device)

7. Sixth Embodiment (Exemplary Configuration of Solid-State Imaging device)

8. Seventh Embodiment (Exemplary Configuration of Solid-State Imaging device)

9. Eighth Embodiment (Exemplary Configuration of Electronic Apparatus)

1. Exemplary Overall Configuration of MOS Solid-State Imaging Device

Figure 1:
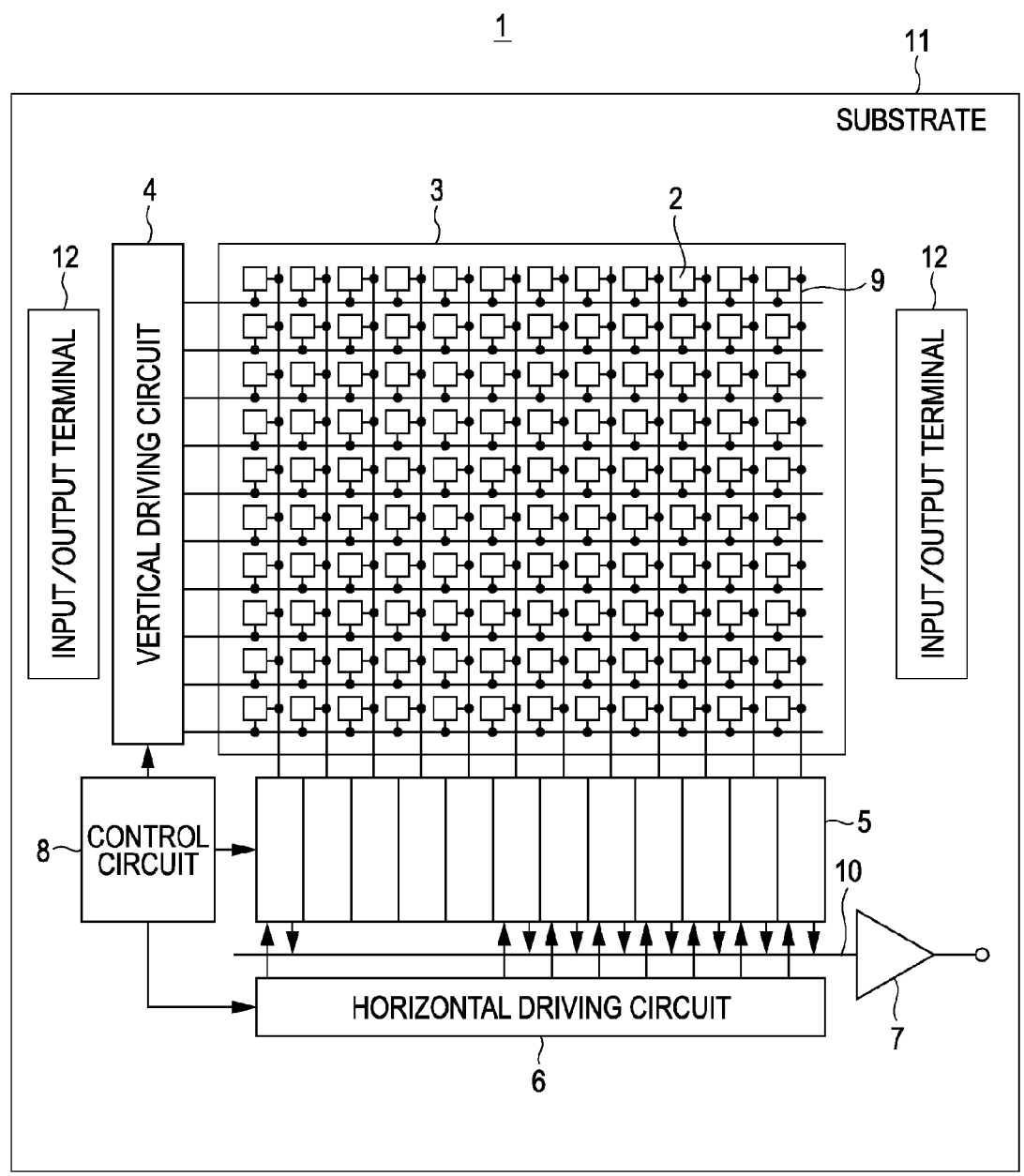
FIG. 1 is a schematic diagram illustrating an exemplary solid-state imaging device according to each embodiment of the invention.

FIG. 1 is a schematic diagram illustrating the configuration of an exemplary MOS solid-state imaging device according to each embodiment of the invention. As shown in FIG. 1, a solid-state capturing device 1 includes a pixel section 3, where pixels 2 including plural photoelectric conversion elements are uniformly arranged two-dimensionally on a semiconductor substrate 11 such as a silicon substrate, and a peripheral circuit section. The pixel 2 includes a photodiode, which is an example of a photoelectric conversion element, and plural pixel transistors (so-called MOS transistors). The plural pixel transistors may include three transistors, that is, a transmission transistor, a reset transistor, and an amplification transistor. Alternatively, the plural pixel transistors may include four transistors including a selection transistor. Since the equivalent circuit of a unit pixel is similar to a general equivalent circuit, the detailed description is omitted. The pixel 2 may be formed as one unit pixel. Alternatively, the pixel 2 may be formed as a shared pixel. The shared pixel includes plural photodiodes, plural transmission transistors, one shared floating diffusion, and each shared pixel transistor. That is, in the shared pixel, the photodiodes and the transmission transistors of the plural unit pixels share each pixel transistor.

The peripheral circuit section includes a vertical driving circuit 4, column signal processing circuits 5, a horizontal driving circuit 6, an output circuit 7, and a control circuit 8.

The control circuit 8 receives data to instruct an input clock, an operation mode, or the like and outputs data such as internal information of the solid-state imaging device. That is, the control circuit 8 generates a clock signal or a control signal serving as a reference signal of the operations of the vertical driving circuit 4, the column signal processing circuits 5, the horizontal driving circuit 6, and the like in accordance with a vertical synchronous signal, a horizontal synchronous signal, and a master clock. These signals are input to the vertical driving circuit 4, the column signal processing circuits 5, the horizontal driving circuit 6, and the like.

The vertical driving circuit 4, which includes a shift register, for example, selects pixel driving wires, supplies pulses used to drive pixels to the selected pixel driving wires, and drives the pixels in a row unit. That is, the vertical driving circuit 4 selectively scans the pixels 2 of the pixel section 3 sequentially in a row unit in a vertical direction and supplies the column signal processing circuits 5, via the vertical signal lines 9, with pixel signals corresponding to signal charges generated in accordance with an amount of light received in the photodiodes, for example, serving as the photoelectric conversion element of each pixel 2.

The column signal processing circuit 5 is disposed in every column of the pixels 2, for example. The column signal processing circuit 5 executes a signal processing operation, such as a noise removing operation, on signals output from the one-row pixels 2 in each pixel column. That is, the column signal processing circuit 5 executes a signal processing operation such as a CDS operation of removing a fixed pattern noise intrinsic to the pixel 2, a signal amplifying operation, or an AD converting operation. Horizontal selection switches (not shown) are disposed and connected between the output terminals of the column signal processing circuits 5 and the horizontal signal line 10.

The horizontal driving circuit 6 includes a shift register, for example. The horizontal driving circuit 6 sequentially outputs horizontal scanning pulses and sequentially selects the column signal processing circuits 5 to output the pixel signals from the column signal processing circuits 5 to the horizontal signal line 10.

The output circuit 7 executes a signal processing operation on the signals sequentially supplied from the column signal processing circuits 5 via the horizontal signal line 10. For example, the output circuit 7 executes only a buffering operation, a black-level adjusting operation, and various digital signal processing operations. Input/output terminals 12 exchange signals with an external device.

2. First Embodiment

Exemplary Configuration of Solid-State Imaging Device

Figure 2:
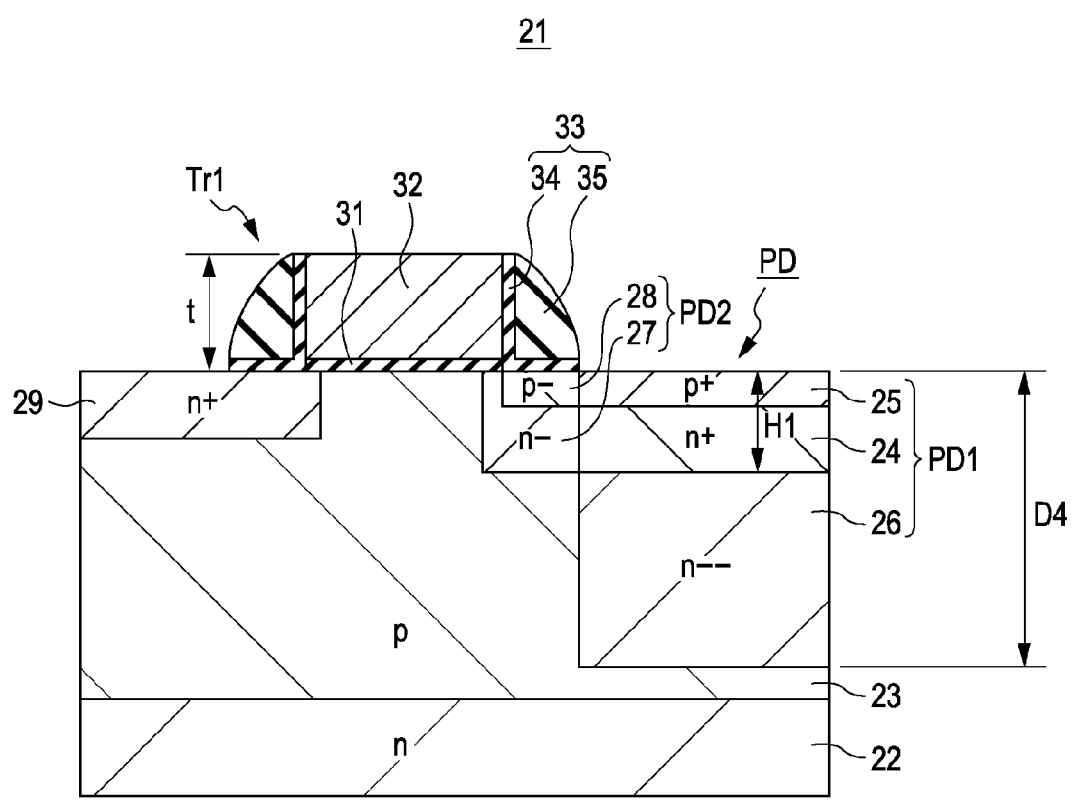
FIG. 2 is a schematic sectional view illustrating main elements of the solid-state imaging device according to a first embodiment of the invention.

FIG. 2 is a diagram illustrating main elements of the solid-state imaging device according to a first embodiment of the invention. The solid-state imaging device according to this embodiment is an MOS solid-state imaging device. FIG. 2 shows the main elements including a transmission transistor and photodiodes serving as a photoelectric conversion element. A solid-state imaging device 21 according to the first embodiment includes a semiconductor substrate in which a semiconductor well area 23 of a second conductive type, for example, a p-type, is formed on a semiconductor substrate (silicon substrate) 22 of a first conductive type, for example, an n-type. A photodiode PD and plural pixel transistors, for example, a transmission transistor Tr1, which is representatively formed in this embodiment, are formed in the area of one unit pixel of the p-type semiconductor well area 23. That is, each unit pixel has a photodiode area where the photodiode is formed and a pixel transistor area where the plural pixel transistors are formed.

The plural photodiode PD are formed in the photodiode area. For example, two photodiodes PD (PD1 and PD2) are formed in this embodiment. The photodiodes are formed with no element separating area interposed therebetween and in which the impurity concentrations of the semiconductor areas forming pn junctions (that is, pn junction areas) are different from each other. The photodiodes PD1 and PD2 are formed as a so-called buried type photodiode having the pn junction. The first photodiode PD1 is formed away from a transmission gate and the second photodiode PD2 is formed close to the transmission gate so as to continue with the first photodiode PD1. The second photodiode PD2 is formed in a semiconductor area of an impurity concentration lower than that of the first photodiode PD1.

The first photodiode PD1 includes a relatively high impurity concentration second conductive type semiconductor area serving as a main charge storage area, for example, an n-type semiconductor area 24 and a relatively high impurity concentration p-type semiconductor area 25 formed on the semiconductor surface of the semiconductor area 24. The second photodiode PD2 includes a relatively low impurity concentration n-type semiconductor area 27 and a low impurity concentration p-type semiconductor area 28 formed on the semiconductor surface of the semiconductor area 27. At one section of the n-type semiconductor areas 24 and 27 and the p-type semiconductor areas 25 and 28 included in the first photodiode PD1 and the second photodiode PD2, respectively, is continuously formed. In the first photodiode PD1, a low impurity concentration n-type semiconductor area 26, which serves as a charge storage area, is formed continuously below the n-type semiconductor area 24. Here, a distance D4 between the substrate surface to the low impurity concentration n-type semiconductor area 26 may be configured to be equal to the above-described D1 (D4=D1).

The high impurity concentration p-type semiconductor area 25 also serves as a hole charge storage area inhibiting dark current, that is, inhibiting occurrence of a white dot. The low impurity concentration p-type semiconductor area 28 also serves as a hole charge storage area inhibiting dark current, that is, inhibiting occurrence of a white dot.

In the transmission transistor Tr1, the n-type semiconductor areas 24 and 27 of the photodiodes PD serve as a source area and an n-type semiconductor area 29, which is the floating diffusion, serves as a drain area and a transmission gate electrode 32 is formed on the substrate between the source area and the drain area with a gate insulating film 31 interposed therebetween. The transmission gate electrode 32 is formed of a polysilicon film doped with impurities, for example, n-type impurities in this embodiment. A side wall 33 formed by an insulating film is formed on the side of the transmission gate electrode 32. In this embodiment, the side wall 33 has a two-layered structure of a silicon oxide film 34 and a silicon nitride film 35.

In this embodiment, the second photodiode PD2 is formed using the transmission gate electrode 32 as a mask by ion-implanting. The first photodiode PD1 is formed using the sidewall 33 and the transmission gate electrode 32 as a mask by ion-implanting. The n-type semiconductor area 27 and the p-type semiconductor area 28 of the second photodiode PD2 are formed with a first weak concentration by ion-implanting. The n-type semiconductor area 24 and the p-type semiconductor area 25 of the first photodiode PD1 are formed with the first weak concentration by ion-implanting and are formed also with a second weak concentration by ion-implanting. Therefore, the first photodiode PD1 is configured to have the high impurity concentration n-type semiconductor area 24 and the high impurity concentration p-type semiconductor area 25. The second photodiode PD2 is configured to have the high impurity concentration n-type semiconductor area 27 and the low impurity concentration p-type semiconductor area 28.

Moreover, the n-type semiconductor areas 24 and 27 and the p-type semiconductor areas 25 and 28 included in the first photodiode PD1 and the second photodiode PD2, respectively, are formed under the condition that an implantation energy (hereinafter, referred to as an acceleration energy) is low. That is, the acceleration energy is set as a low acceleration energy which does not pass through the transmission gate electrode 32 and the gate insulating film 31. In addition, the n-type semiconductor areas 24 and 27 and the p-type semiconductor areas 25 and 28 are formed with a low dose amount by ion-implanting.

In this embodiment, the low impurity concentration second photodiode PD2 is formed just below a part of the transmission gate electrode 32 and just below the side wall 33. In this embodiment, the n-type semiconductor area 27 is formed from a portion just below the side wall 33 to a portion just below the transmission gate electrode 32.

The p-type semiconductor area 28 is formed in the interface just below the side wall 33. In the first photodiode PD1, the high impurity concentration n-type semiconductor area 24 and the high impurity concentration p-type semiconductor area 25 are formed outside the end edge of the side wall 33.

In this embodiment, the n-type semiconductor areas 24 and 27 have the same depth and the p-type semiconductor areas 25 and 28 have the same depth in the first photodiode PD1 and the second photodiode PD2.

The first photodiode PD1 and the second photodiode PD2 are formed by self-alignment without using a two-layered resistor film. As described below, the transmission gate electrode 32 is first formed, and then the low impurity concentration n-type semiconductor area 27 is formed in a shallow area by ion-implanting n-type impurities of a low dose amount with a low acceleration energy using the transmission gate electrode 32 as a mask. Subsequently, the low impurity concentration p-type semiconductor area 28 is formed in the interface of the substrate surface by ion-implanting p-type impurities of a low dose amount with an acceleration energy lower than that in the ion-implanting of the n-type impurities using the transmission gate electrode 32 as a mask in the same way.

Here, it is preferable that the n-type semiconductor area 27 extends toward the transmission gate electrode 32 only by a necessary distance so as to partially overlap with the transmission gate electrode 32. Accordingly, the n-type semiconductor area 27 may be formed so as to overlap with the transmission gate electrode 32 by performing tilt ion-implanting with n-type impurities using the transmission gate electrode 32 as a mask, for example. Alternatively, by using a difference between the diffusion coefficients of the n-type impurities and the p-type impurities, the n-type semiconductor area 27 may be formed so as to partially overlap with the transmission gate electrode 32 by heating after the ion-implanting. Alternatively, by performing annealing after the ion-implanting of the n-type impurities and then ion-implanting the p-type impurities, the n-type semiconductor area 27 may be formed so as to partially overlap with the transmission gate electrode 32.

Even though not shown, by using a difference between the diffusion coefficients of the n-type impurities and the p-type impurities, the low impurity concentration p-type semiconductor area 28 extends more than the n-type semiconductor area 27 so as to partially overlap with the transmission gate electrode 32. The profiles of the impurities concentrations of the n-type semiconductor area 27 and the p-type semiconductor area 28 below the vicinity of the end of the transmission gate electrode 32 can be separately controlled by the self-alignment. That is, it is possible to optimize the profile of the impurity concentration below the vicinity of the end of the transmission gate electrode 32. It is effective to miniaturize a pixel.

Subsequently, the side wall 33 is formed on the side of the transmission gate electrode 32, and then ion-implanting is performed with a low dose amount and a low acceleration energy, for example, using the side wall 33 and the transmission gate electrode 32 as a mask. The p-type impurities are ion-implanted with the same dose amount and the low acceleration energy. In the two-time ion-implanting of the n-type and p-type impurities, as described below, the ion-implanting is performed with the low acceleration energy so that the depth from the substrate surface to a range distance Rp of the ion-implanting is smaller than a thickness t of the gate insulating film 31 and the transmission gate electrode 32.

Figure 14:
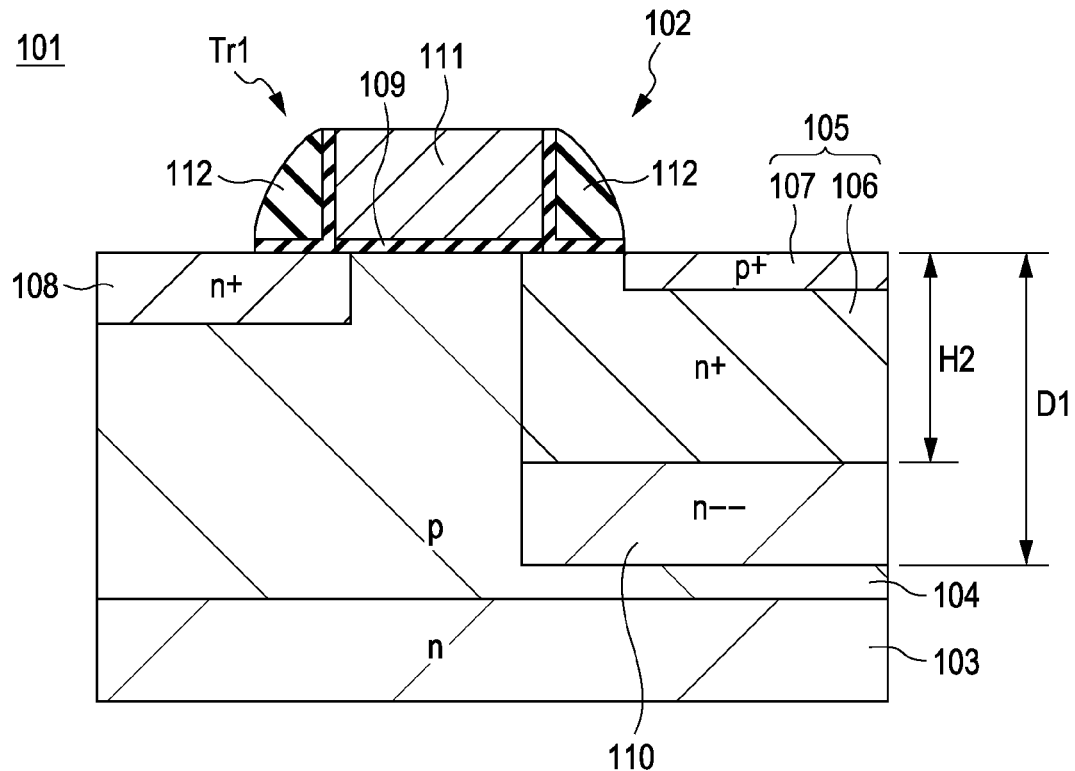
FIG. 14 is a sectional view illustrating the main elements of an exemplary solid-state imaging device according to the related art.
Figure 15:
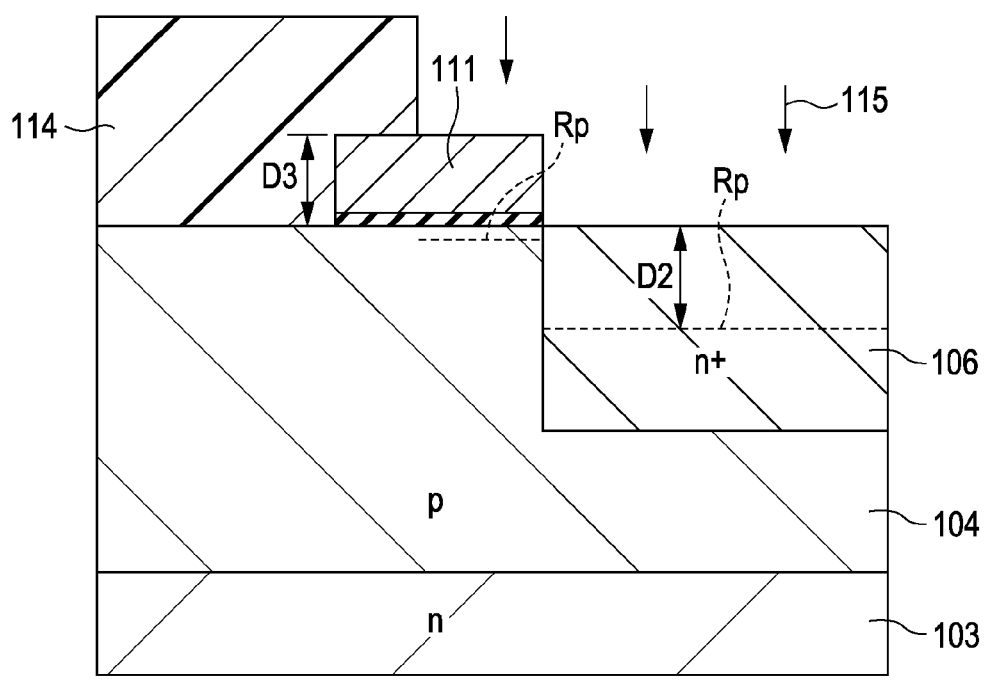
FIG. 15 is an explanatory diagram illustrating the solid-state imaging device in ion-implantation according to the related art.
Figure 16:
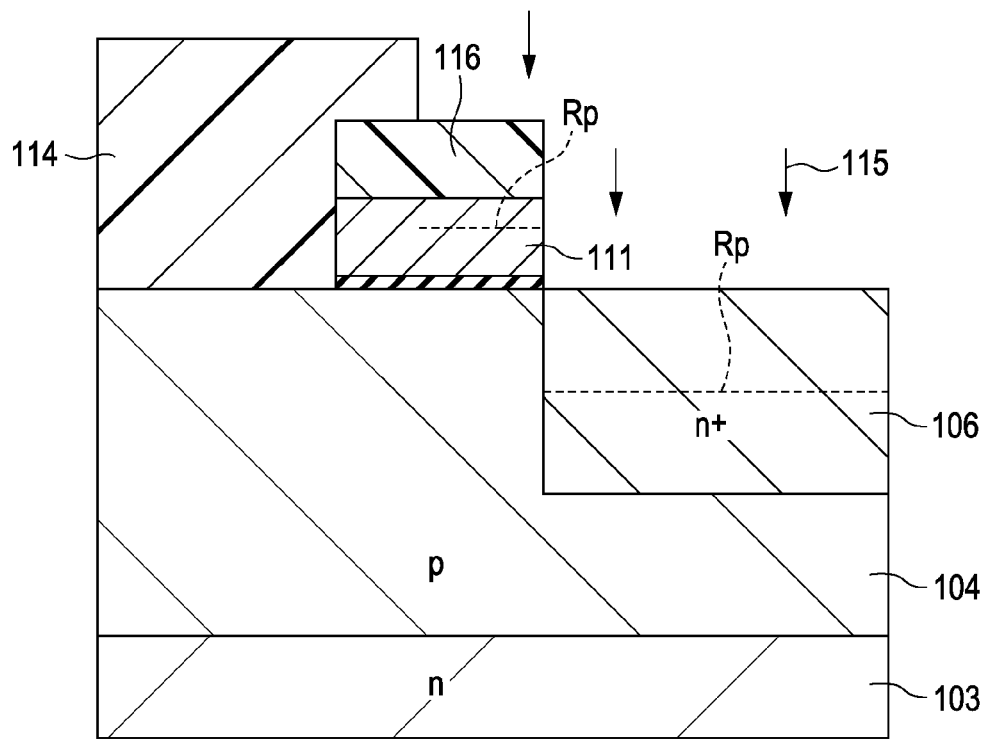
FIG. 16 is an explanatory diagram illustrating the solid-state imaging device in ion-implantation according to the related art.

By the two-time ion-implanting, the low impurity concentration second photodiode PD2 is formed just below the side wall 33 and the high impurity concentration first photodiode PD1 is formed outside the end edge of the side wall 33. Moreover, the high impurity concentration n-type semiconductor area 24 serving as a main charge storage area is formed in the shallow position from the substrate surface, compared to an example according to the related art. That is, on the assumption that the depth D4 (=D1) from the substrate surface to the bottom surface of the n-type semiconductor area 26 is constant, the depth of the charge storage area 6 of the example according to the related art in FIG. 14 is H2. In this embodiment, a depth H1 of the charge storage area 24 is shallower than that in the example according to the related art (H1<H2).

In the solid-state imaging device 21, even though not shown, the photodiodes PD and the plural pixel transistors including the transmission transistor Tr1 are formed, and then a multi-layered wire layer, in which wires of plural layers are formed with an inter-layer insulating film interposed therebetween, is formed. The multi-layered wire layer is not formed in a portion corresponding to the photodiodes PD. An on-chip color filter and an on-chip micro lens are sequentially formed on the multi-layered wire layer with a flattened film interposed therebetween. The MOS solid-state imaging device 21 is of a surface emission type.

In the solid-state imaging device 21 according to the first embodiment, signal charges (electrons in this embodiment) subjected to photoelectric conversion by the first photodiode PD1 during a charge storage period (light reception period) are mainly stored and maintained in the n-type semiconductor area 24 of the high concentration which is close to the substrate surface. During a period during which the signal charges are stored and maintained, in the first photodiode PD1, the upwelling of the charges (electrons) from the interface with the substrate surface may be inhibited by the high impurity concentration p-type semiconductor area 25, in the vicinity of the interface of the substrate surface.

On the other hand, since the low impurity concentration second photodiode PD2 is formed just below the side wall 33, the upwelling of the charge (electrons) from the interface with the wide wall 33 may be inhibited by the p-type semiconductor area 28 of the second photodiode PD2. During the charge storage period during which the signal charges are stored and maintained, the upwelling of the charges below the side wall 33 may be inhibited even at 0 V without applying a negative bias voltage to the transmission gate electrode 32. Accordingly, it is possible to inhibit the occurrence of a white point.

In the solid-state imaging device 21, by a reading voltage Vtg to the transmission gate electrode 32 of the transmission transistor Tr1, the signal charges stored in the photodiodes PD are read in the n-type semiconductor area 29 of the floating diffusion. In this case, in the photodiode PD, the magnitude of an electric field in a lateral direction on the side of the transmission gate of the photodiode PD is relaxed, since the low impurity concentration second photodiode PD2 is formed close to the transmission gate. That is, the magnitude of the electric field in the side close to the transmission gate of the photodiode PD is relaxed. Therefore, when the reading voltage Vtg is applied, the potential in the side close to the transmission gate of the n-type semiconductor area 24 is easily modulated, and thus the signal charges in the photodiodes PD are easily read.

On the other hand, when the transmission gate is turned on, the electric field in the silicon is easily applied in the substrate surface. In this embodiment, the n-type semiconductor area 24 serving as the main charge storage area of the first photodiode PD1 is formed at the shallow position of the substrate. Therefore, when the transmission gate is turned on, the electric field is easily applied to the n-type semiconductor area 24, and thus the signal charges are read more easily. Accordingly, it is possible to make the reading voltage Vtg lower.

In this embodiment, even when the pixel is miniaturized, the photodiodes PD are formed by the self-alignment. Therefore, the afterimage of a signal and a gap between white dots are reduced. Since the profiles of the impurities concentrations of the n-type semiconductor area 27 and the p-type semiconductor area 28 below the vicinity of the end of the transmission gate electrode 32 can be separately controlled by the self-alignment, it is possible to optimize the profile of the impurity concentration below the vicinity of the end of the transmission gate electrode 32. It is effective to miniaturize a pixel.

In this embodiment, the main charge storage area is the high impurity concentration n-type semiconductor area 24. However, the signal charges are also stored in the low impurity concentration n-type semiconductor area 27. Therefore, a saturation signal charge amount Qs is improved as a whole.

In the solid-state imaging device 21 according to the first embodiment, as described above, the pixel is miniaturized. Therefore, even when the thickness of the gate electrode of the pixel transistor and the thickness of a resist mask become thin, the photodiodes PD can be formed by the self-alignment. Moreover, the afterimage is inhibited with improvement in a reading characteristic and the occurrence of a white dot can be further inhibited. Accordingly, both the occurrence of an afterimage and the occurrence of a white dot can be inhibited.

Method of Manufacturing Solid-State Imaging Device

Figure 3A:
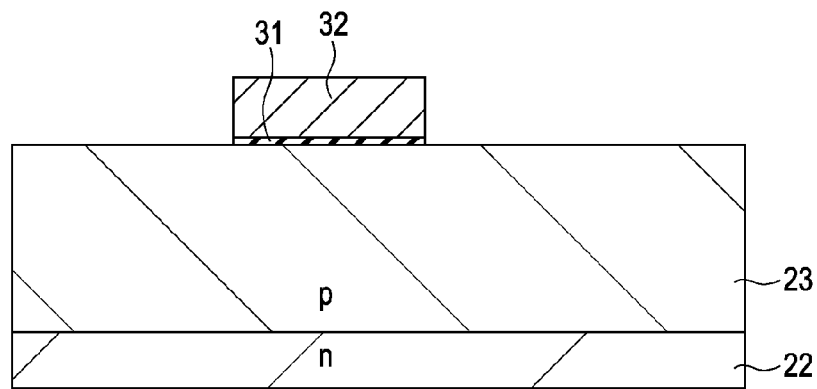
FIGS. 3A to 3C are diagrams (first manufacture diagrams) illustrating a method of manufacturing the solid-state imaging device according to the first embodiment.

A method of manufacturing the solid-state imaging device 21 according to the first embodiment will be described with reference to FIGS. 3A to 3C and FIG. 4. FIGS. 3A to 3C and FIG. 4 show the main elements including the photodiodes and the transmission transistor of one unit pixel. First, as shown in FIG. 3A, a base semiconductor substrate is prepared in which the second conductive type, for example, p-type semiconductor well area 23 is formed on a first conductive type, for example, n-type semiconductor substrate 22 (for example, a silicon substrate). In a necessary area which becomes an imaging area of the p-type semiconductor area 23, a transmission gate electrode 32, which is formed of, for example, a polysilicon film doped with impurities, is formed with the gate insulating film (for example, a silicon oxide film) 31 interposed therebetween and in an area where the transmission transistor of each unit pixel is formed. The transmission gate electrode 32 is formed of a polysilicon film doped with n-type impurities, for example. With the miniaturization of a pixel, the transmission gate electrode 32 is formed so as to be thinner than that of an example according to the related art.

Figure 3B:
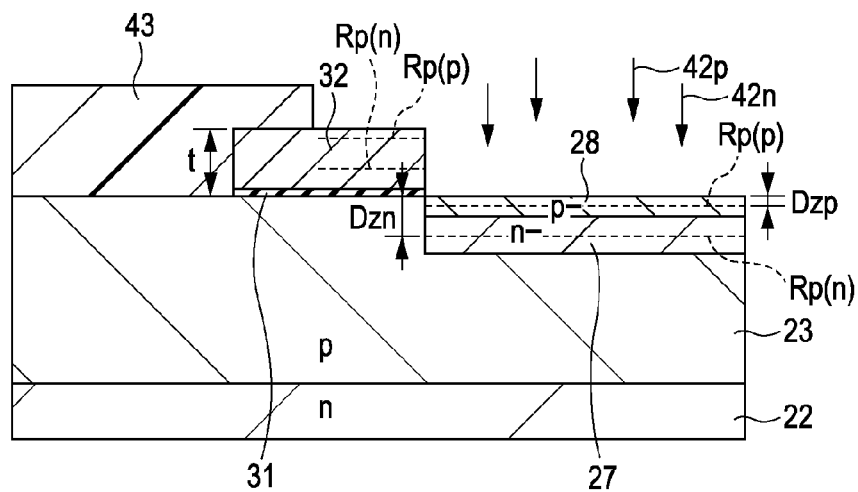

Subsequently, as shown in FIG. 3B, a resist mask 41 is formed so as to extend to a part of the transmission gate electrode 32 other than the area where the photodiodes PD are formed. With the miniaturization of a pixel, the resist mask 41 is also formed so as to be thinner than that of the example according to the related art. Using the transmission gate electrode 32 as a mask, the n-type semiconductor area 27 is formed by ion-implanting n-type impurities 42n, for example, arsenic by the self-alignment. The ion-implanting of the n-type impurities 42n is performed with the low dose amount and the low acceleration energy with which the range distance Rp(n) reaches the position of a depth Dzn smaller than the thickness t of the transmission gate electrode 32 from the substrate surface.

Subsequently, using the transmission gate electrode 32 as a mask, the p-type semiconductor area 28 is formed on the n-type semiconductor area 27 by ion-implanting p-type impurities 42p, for example, boron by the self-alignment. The ion-implanting of the p-type impurities 42p is performed with the low dose amount and with the low acceleration energy with which the range distance Rp(p) reaches the position of a depth Dzp smaller than the thickness t of the transmission gate electrode 32 and shallower than the depth Dzn from the substrate surface.

Figure 3C:
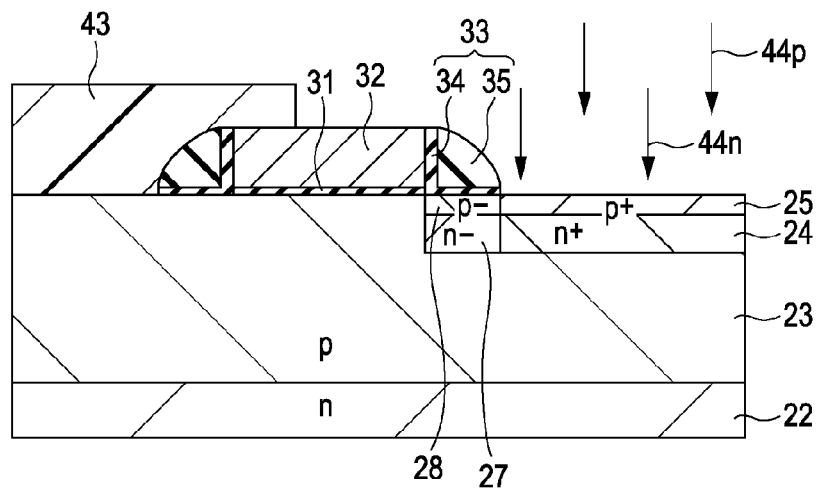

Subsequently, as shown in FIG. 3C, the side wall 33 is formed of an insulating film on the side of the transmission gate electrode 32 by a general method. In this embodiment, the side wall 33 has the two-layered structure of the silicon oxide film 34 and the silicon nitride film 35. Subsequently, in the same way described above, a resist mask 43 is formed so as to extend to the part of the transmission gate electrode 32 other than the area where the photodiodes PD are formed. Using the side wall 33 and the transmission gate electrode 32 as a mask, the n-type semiconductor area 24 is formed by ion-implanting n-type impurities 44n under the same above-described ion-implanting condition, for example, by the self-alignment. That is, in the embodiment, the implantation thickness of the n-type impurities 42n is configured to be the same as the implantation thickness of the n-type impurities 44n in the ion-implanting.

Subsequently, using the side wall 33 and the transmission gate electrode 32 as a mask, the p-type semiconductor area 25 is formed by ion-implanting p-type impurities 44p under the same above-described ion-implanting condition, for example, by the self-alignment. That is, in the embodiment, the implantation thickness of the p-type impurities 42p is configured to be the same as the implantation thickness of the p-type impurities 44p in the ion-implanting. Since the n-type semiconductor area 24 and the p-type semiconductor area 25 are formed under the same ion-implanting condition by the two-time ion-implanting, the n-type semiconductor area 24 and the p-type semiconductor area 25 have impurity concentration higher than the impurity concentration of the n-type semiconductor area 27 and the p-type semiconductor area 28 formed by one-time ion-implanting. The n-type semiconductor area 24 serves as the main charge storage area.

In the second ion-implanting of the n-type impurities and the p-type impurities, the range distances Rp(p) and Rp(n) may be the same those of the first ion-implanting and the dose amount may be larger or smaller than that of the first ion-implanting.

In this way, the buried-type second photodiode PD2 including the low impurity concentration n-type semiconductor area 27 and the low impurity concentration p-type semiconductor area 28 is formed below the side wall 33. The buried-type first photodiode PD1 including the high impurity concentration n-type semiconductor area 24 and the high impurity concentration p-type semiconductor area 25 is formed outside the end edge of the side wall 33 so as to continue with the second photodiode PD2. In this way, the photodiodes PD of a pixel are formed so as to include the two photodiodes PD1 and PD2.

After the process in FIG. 3B, by using the difference between the diffusion coefficients of the p-type impurities and the n-type impurities, the n-type semiconductor area 27 may be formed so as to extend below a part of the transmission gate electrode 32 by the heating performed upon forming the side wall. Alternatively, in the process in FIG. 3B, the n-type semiconductor area 27 partially overlapping with a portion below the transmission gate electrode 32 may selectively be formed with the n-type impurities by performing the tilt ion-implanting using the transmission gate electrode 32 as a mask. In addition, after the process in FIG. 3B, by using the difference between the diffusion coefficients of the p-type impurities and the n-type impurities, the p-type semiconductor area 28 may be formed so as to extend further than the n-type semiconductor area 27 and partially overlap with the transmission gate electrode 32 by the heating performed upon forming the side wall.

Figure 4:
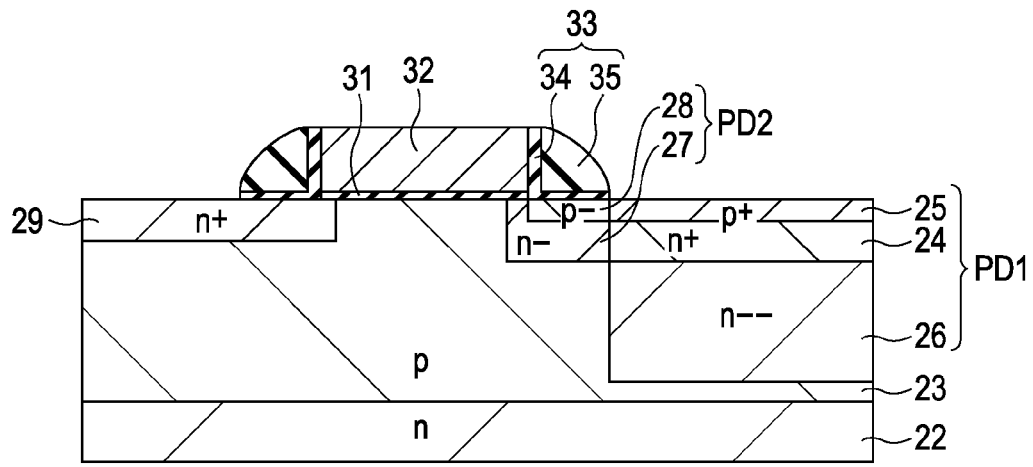
FIG. 4 is a diagram (second manufacture diagram) illustrating the method of manufacturing the solid-state imaging device according to the first embodiment.

As shown in FIG. 4, the n-type semiconductor area 29 serving as the floating diffusion (FD) is formed in the p-type semiconductor well area 23. In the first photodiode PD1, the low impurity concentration n-type semiconductor area 26 is formed by a necessary depth below the n-type semiconductor area 24 serving as the charge storage area so as to continue with the n-type semiconductor area 24. The n-type semiconductor area 26 is formed by the self-alignment by ion-implanting n-type impurities of a low dose amount using the side wall 33 and the transmission gate electrode 32 as a mask.

After the photodiodes PD and the plural pixel transistors are formed, the multi-layered wire layer, in which wires of plural layers are formed with the inter-layer insulating film interposed therebetween, is formed by a general method. The on-chip color filter and the on-chip micro lens are formed with the flattened film interposed therebetween. In this way, it is possible to obtain the solid-state imaging device 21 according to the first embodiment.

In the method of manufacturing the solid-state imaging device 21 according to this embodiment, the photodiodes PD can be formed by the self-alignment by performing the ion-implanting using the transmission gate electrode 32 as a mask and performing the ion-implanting using the transmission gate electrode 32 and the side wall 33. That is, the low impurity concentration second photodiode PD2, which includes the n-type semiconductor area 27 and the p-type semiconductor area 28 formed by performing the first ion-implanting using the transmission gate electrode 32 as a mask, is formed below the side wall 33 so as to be partially overlapped with the transmission gate electrode. In addition, the high impurity concentration first photodiode PD1 is formed outside the end of the side wall by the second ion-implanting of the impurities after the formation of the side wall 33. By forming the photodiodes PD1 and PD2 of the different impurity concentrations, it is possible to manufacture the solid-state imaging device 21 capable of improving the reading characteristic and inhibiting the afterimage and a white dot.

Since the ion-implanting of the n-type impurities is performed by the range distance Rp(n) smaller than the thickness of the transmission gate electrode 32, the n-type impurities do not pass through the transmission gate electrode 32. By setting the acceleration energies of the first ion-implanting and the second implanting so as to be the same as each other, the high impurity concentration n-type semiconductor area 24 serving as a charge storage area can be formed at a shallow position and the p-type semiconductor area 25 serving as the hole charge storage area can be formed on the n-type semiconductor area 24.

Accordingly, even when the pixel is miniaturized, the photodiodes PD are formed by the self-alignment and thus it is possible to manufacture the solid-state imaging device capable of inhibiting both the occurrence of an afterimage and a white dot.

3. Second Embodiment

Exemplary Configuration of Solid-State Imaging Device

Figure 5:
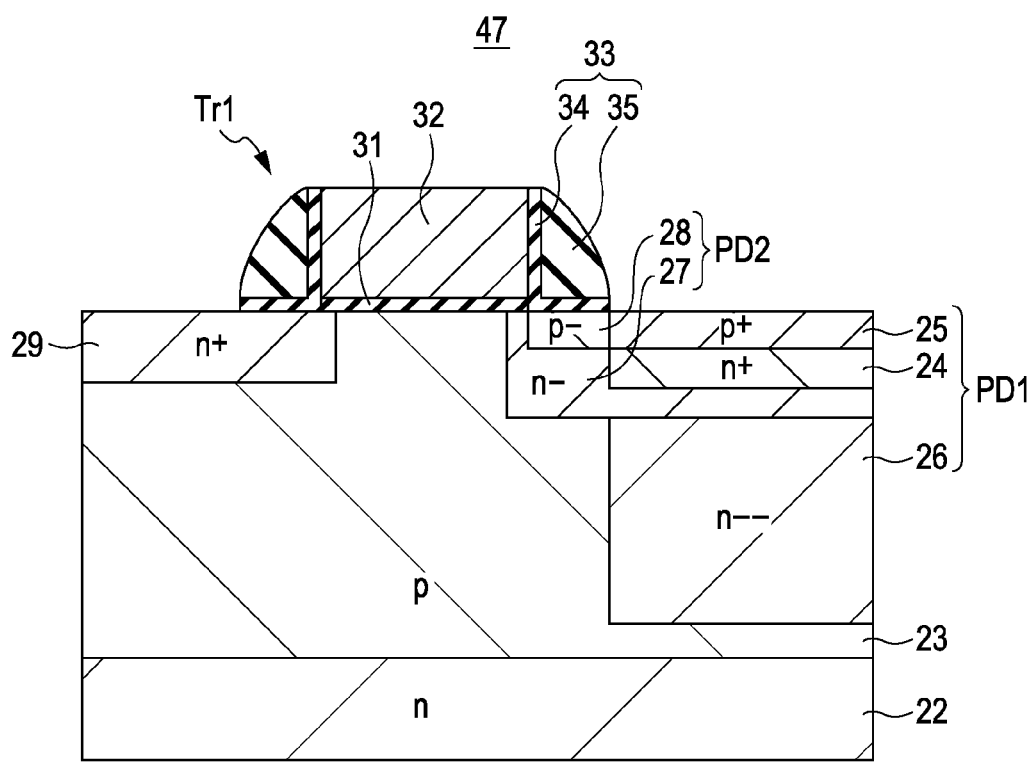
FIG. 5 is a schematic sectional view illustrating main elements of a solid-state imaging device according to a second embodiment of the invention.

FIG. 5 is a diagram illustrating a solid-state imaging device according to a second embodiment of the invention. The solid-state imaging device according to this embodiment is an MOS solid-state imaging device. FIG. 5 shows main elements including photodiodes serving as the photoelectric conversion element and a transmission transistor. As in the above-described first embodiment, a solid-state imaging device 47 according to the second embodiment includes, as photodiodes PD forming a pixel, a low impurity concentration second photodiode PD2 and a high impurity concentration first photodiode PD1. The second photodiode PD2 includes a low impurity concentration n-type semiconductor area 27 just below a part of the transmission gate electrode 32 and just below the side wall 33 and a low impurity concentration p-type semiconductor area 28 just below the side wall 33. The first photodiode PD1 includes a high impurity concentration n-type semiconductor area 24 serving as a charge storage area and formed outside the end edge of the side wall 33 and a high impurity concentration p-type semiconductor area 25 on the n-type semiconductor area 24.

In this embodiment, the low impurity concentration n-type semiconductor area 27 of the second photodiode PD2 extends below the n-type semiconductor area 24 of the charge storage area. The low impurity concentration n-type semiconductor area 27 and the low impurity concentration p-type semiconductor area 28 slightly diffuse by the heating performed upon forming the side wall 33. By this diffusion, the high impurity concentration n-type semiconductor area 24 does not overlap with the low impurity concentration n-type semiconductor area 27 and the low impurity concentration n-type semiconductor area 27 is formed deeper than the high impurity concentration n-type semiconductor area 24.

The first photodiode PD1 is formed such that a low impurity concentration n-type semiconductor area 26 is formed below the n-type semiconductor area 24.

Since the other configuration of the photodiodes PD and the transmission transistor Tr1 are the same as that of the first embodiment, the same reference numerals are given to the elements corresponding to those in FIG. 2 and the repeated description is omitted.

A method of manufacturing the solid-state imaging device 47 according to the second embodiment is performed in the same way as that of the manufacturing method described in the first embodiment.

In the solid-state imaging device 47 according to the second embodiment, as described above in the first embodiment, even when the pixel is further miniaturized and thus the thickness of the gate electrode of the pixel transistor and the thickness of the resist mask become thin, the photodiodes PD can be formed by the self-alignment. As in the first embodiment, since the low impurity concentration second photodiode PD2 is formed close to the transmission gate electrode 32, the magnitude of an electric field in a lateral direction on the side of the transmission gate of the photodiode PD is relaxed. The n-type semiconductor area 24 serving as a main electric field storage area is formed at a shallow position of the substrate. Since the signal charges are more easily read, the reading voltage Vtg can be lowered. Moreover, since the p-type semiconductor area 28 of the second photodiode PD2 is formed in the vicinity of the interface below the side wall 33, the upwelling of the charges (electrons) from the interface may be inhibited and thus the occurrence of a white dot can be inhibited. Moreover, in the second embodiment, the afterimage is also inhibited with improvement in the reading characteristic and the occurrence of a white dot can be further inhibited. Accordingly, both the occurrence of an afterimage and the occurrence of a white dot can be inhibited.

Since the low impurity concentration n-type semiconductor area 27 extends below the high-impurity concentration n-type semiconductor area 24 serving as the charge storage area, the potential gradient is formed toward the n-type semiconductor area 24 of the charge storage area in all of the n-type semiconductor areas. Accordingly, the signal charges generated in the n-type semiconductor area 26 can effectively be moved to the n-type semiconductor area 24 serving as the charge storage area and can be stored by the potential gradient. In this embodiment, the same advantages as those of the first embodiment can be obtained.

4. Third Embodiment

Exemplary Configuration of Solid-State Imaging Device

Figure 6:
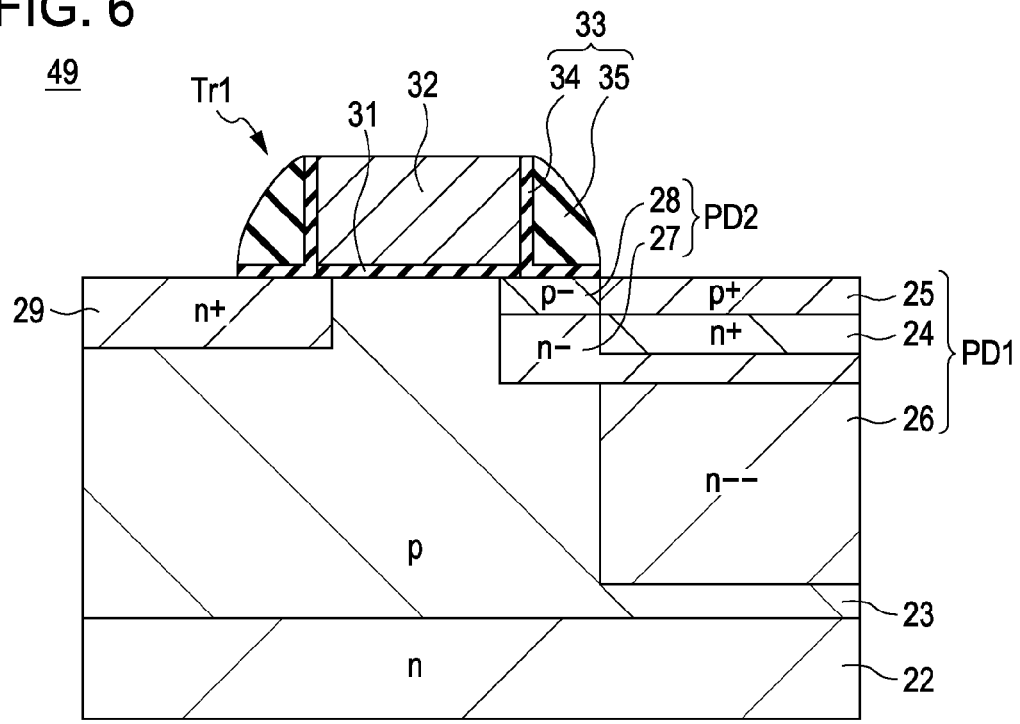
FIG. 6 is a schematic sectional view illustrating main elements of a solid-state imaging device according to a third embodiment of the invention.

FIG. 6 is a diagram illustrating a solid-state imaging device according to a third embodiment of the invention. The solid-state imaging device according to this embodiment is an MOS solid-state imaging device. FIG. 6 shows main elements including photodiodes serving as the photoelectric conversion element and a transmission transistor. As in the above-described first embodiment, a solid-state imaging device 49 according to the third embodiment includes, as photodiodes PD forming a pixel, a low impurity concentration second photodiode PD2 and a high impurity concentration first photodiode PD1. The second photodiode PD2 includes a low impurity concentration n-type semiconductor area 27 just below a part of the transmission gate electrode 32 and just below the side wall 33 and a low impurity concentration p-type semiconductor area 28 just below the side wall 33. The first photodiode PD1 includes a high impurity concentration n-type semiconductor area 24 serving as a charge storage area and formed outside the end edge of the side wall 33 and a high impurity concentration p-type semiconductor area 25 on the n-type semiconductor area 24.

In this embodiment, like the low impurity concentration n-type semiconductor area 27, the low impurity concentration p-type semiconductor area 28 of the second photodiode PD2 partially extends below the transmission gate electrode 32. The low impurity concentration n-type semiconductor area 27 and the low impurity concentration p-type semiconductor area 28 are formed at the same area. In addition, below the n-type semiconductor area 27, a low impurity concentration n-type semiconductor area 26 included in the first photodiode PD1 is formed continuously with the n-type semiconductor area 27 interposed therebetween.

Since the other configuration of the photodiodes PD and the transmission transistor Tr1 are the same as that of the first embodiment, the same reference numerals are given to the elements corresponding to those in FIG. 2 and the repeated description is omitted.

A method of manufacturing the solid-state imaging device 49 according to the third embodiment is performed in the same way as that of the manufacturing method described in the first embodiment.

In the solid-state imaging device 49 according to the third embodiment, as described above in the first embodiment, even when the pixel is further miniaturized and thus the thickness of the gate electrode of the pixel transistor and the thickness of the resist mask become thin, the photodiodes PD can be formed by the self-alignment. As in the first embodiment, since the low impurity concentration second photodiode PD2 is formed close to the transmission gate electrode 32, the magnitude of an electric field in a lateral direction on the side of the transmission gate of the photodiode PD is relaxed. The n-type semiconductor area 24 serving as a main electric field storage area is formed at a shallow position of the substrate. Since the signal charges are more easily read, the reading voltage Vtg can be lowered. Moreover, since the p-type semiconductor area 28 of the second photodiode PD2 is formed in the vicinity of the interface below the side wall 33, the upwelling of the charges (electrons) from the interface may be inhibited and thus the occurrence of a white dot can be inhibited. In this way, in the third embodiment, the afterimage is also inhibited with improvement in the reading characteristic and the occurrence of a white dot can be further inhibited. Accordingly, both the occurrence of an afterimage and the occurrence of a white dot can be inhibited.

Since the p-type semiconductor area 28 of the second photodiode PD2 partially extends below the transmission gate electrode 33, the occurrence of a white dot can be further inhibited. In this embodiment, the same advantages as those of the first embodiment can be obtained.

5. Fourth Embodiment

Exemplary Configuration of Solid-State Imaging Device

Figure 7:
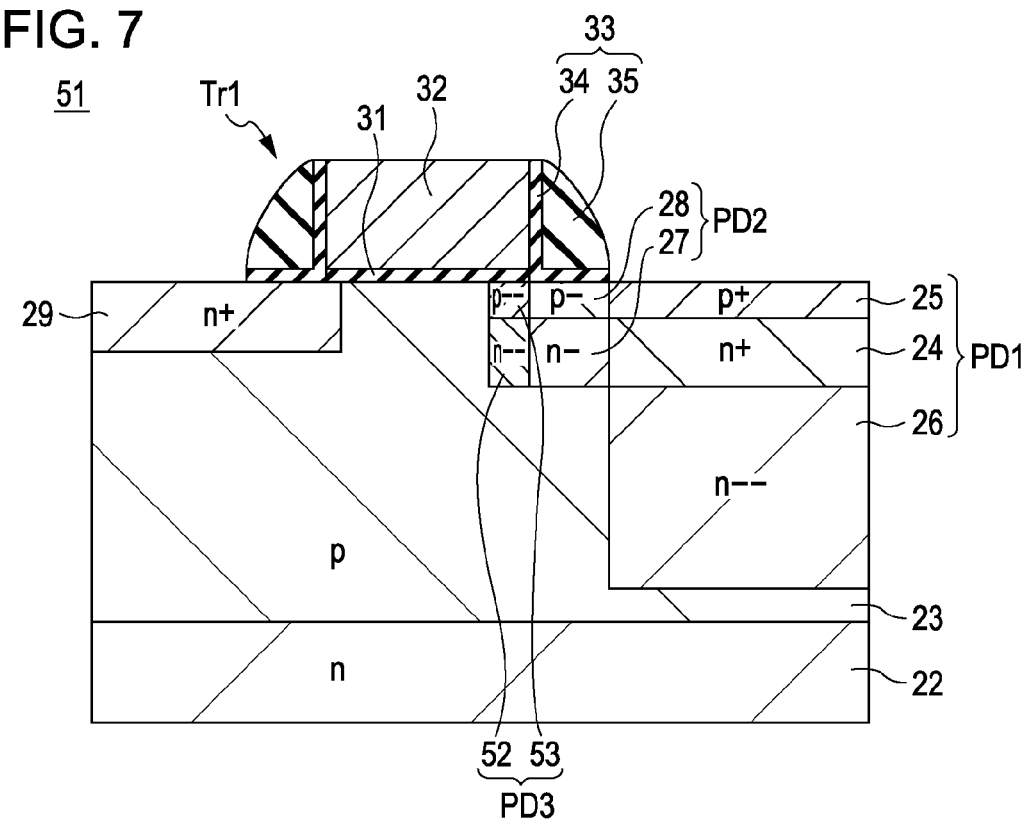
FIG. 7 is a schematic sectional view illustrating main elements of a solid-state imaging device according to a fourth embodiment of the invention.

FIG. 7 is a diagram illustrating a solid-state imaging device according to a fourth embodiment of the invention. The solid-state imaging device according to this embodiment is an MOS solid-state imaging device. FIG. 7 shows main elements including photodiodes serving as the photoelectric conversion element and a transmission transistor. As in the above-described first embodiment, a solid-state imaging device 51 according to the fourth embodiment includes, as photodiodes PD forming a pixel, plural photodiodes PD in which the impurity concentrations of the semiconductor areas forming pn functions are different from each other. In this embodiment, three buried-type photodiodes PD1, PD2, and PD3 having the pn junctions are formed.

Outside the end edge of the side wall 33, the first photodiode PD1 includes a high impurity concentration n-type semiconductor area 24 serving as a main charge storage area and a high impurity concentration p-type semiconductor area 25 on the n-type semiconductor area 24. In addition, an n-type semiconductor area 26 of an impurity concentration lower than that of the n-type semiconductor area 24 is formed below the n-type semiconductor area 24.

The second photodiode PD2 which continues with the first photodiode PD1 includes the n-type semiconductor area 24 and includes an n-type semiconductor area 27 and a p-type semiconductor area 28 of an impurity concentration lower than that of the p-type semiconductor area 25 below the side wall 33. The third photodiode PD3 which continues with the second photodiode PD2 includes the n-type semiconductor area 27 and includes an n-type semiconductor area 52 and a p-type semiconductor area 53 of an impurity concentration lower than that of the p-type semiconductor area 28 below a part of the transmission gate electrode 32.

The n-type semiconductor area 52 and the p-type semiconductor area 53 of the third photodiode PD3 may be formed by tilt ion-implanting using the transmission gate electrode 32 as a mask, for example.

Since the other configuration of the photodiodes PD and the transmission transistor Tr1 are the same as that of the first embodiment, the same reference numerals are given to the elements corresponding to those in FIG. 2 and the repeated description is omitted.

In the solid-state imaging device 51 according to the fourth embodiment, the first photodiode PD1, the second photodiode PD2, and the third photodiode PD3 are formed so that the impurity concentrations are lower toward the transmission gate electrode 32. With such a configuration, the magnitude of an electric field in a lateral direction on the side of the transmission gate of the photodiode PD is relaxed. The high impurity concentration n-type semiconductor area 24 serving as a charge storage area is formed at a shallow position of the substrate. Since the signal charges are more easily read, the reading voltage Vtg can be lowered. Moreover, since the n-type semiconductor area 28 is formed in the vicinity of the interface below the side wall 33 and the p-type semiconductor area 53 is formed in the vicinity of a part of the interface below the transmission gate electrode 32, the upwelling of the charges (electrons) from the interface may be inhibited and thus the occurrence of a white dot can be inhibited.

In the fourth embodiment, the afterimage is also inhibited with improvement in the reading characteristic and the occurrence of a white dot can be further inhibited. Accordingly, both the occurrence of an afterimage and the occurrence of a white dot can be inhibited. In this embodiment, the same advantages as those of the first embodiment can be obtained.

In FIG. 7, the photodiodes PD include the three photodiodes PD1 to PD3, but may include four or more photodiodes of which impurity concentrations are different from each other. In this case, the photodiodes may be formed by tilt ion-implanting and vertical ion-implanting using the transmission gate electrode or/and the side wall.

Method of Manufacturing Solid-State Imaging Device

Figure 8A:
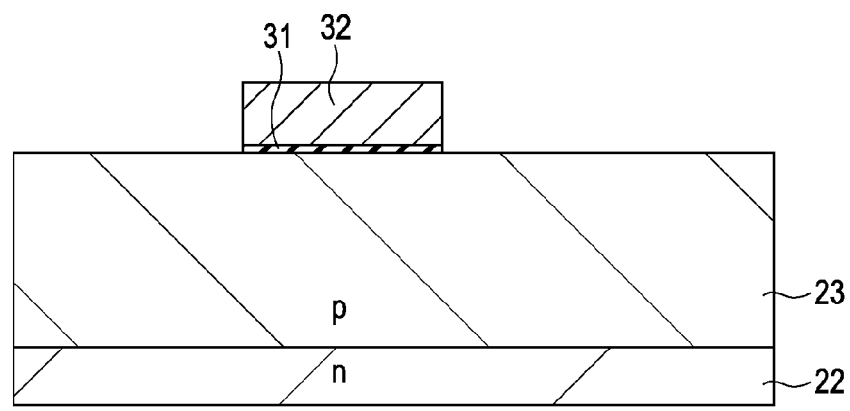
FIGS. 8A to 8C are diagrams (first manufacture diagrams) illustrating a method of manufacturing the solid-state imaging device according to the fourth embodiment.

A method of manufacturing the solid-state imaging device 51 according to the fourth embodiment will be described with reference to FIGS. 8A to 8C and FIGS. 9A and 9B. FIGS. 8A to 8C and FIGS. 9A and 9B show the main elements including the photodiodes and the transmission transistor of one unit pixel. First, as shown in FIG. 8A, a base semiconductor substrate is prepared in which the second conductive type, for example, p-type semiconductor well area 23 is formed on a first conductive type, for example, n-type semiconductor substrate 22 (for example, a silicon substrate). In a necessary area which becomes an imaging area of the p-type semiconductor area 23, a transmission gate electrode 32, which is formed of, for example, a polysilicon film doped with impurities, is formed with the gate insulating film 31 interposed therebetween and in an area where the transmission transistor of each unit pixel is formed. With the miniaturization of a pixel, the transmission gate electrode 32 is formed so as to be thinner than that of an example according to the related art.

Figure 8B:
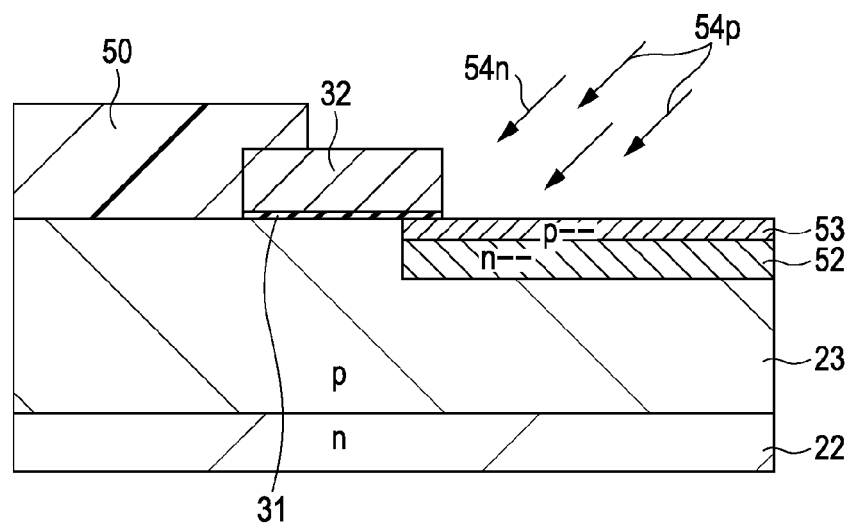

Subsequently, as shown in FIG. 8B, a resist mask 50 is formed so as to extend to a part of the transmission gate electrode 32 other than the area where the photodiodes PD are formed. With the miniaturization of a pixel, the resist mask 50 is also formed so as to be thinner than that of the example according to the related art. Using the transmission gate electrode 32 as a mask, the n-type semiconductor area 52 is formed by ion-implanting n-type impurities 54n, for example, arsenic by the self-alignment. The ion-implanting of the n-type impurities 54n is performed with the low dose amount and the low acceleration energy with which the range distance Rp(n) reaches the position smaller than the thickness t of the transmission gate electrode 32 from the substrate surface.

Subsequently, using the transmission gate electrode 32 as a mask, the p-type semiconductor area 53 is formed on the n-type semiconductor area 52 by ion-implanting p-type impurities 54p, for example, boron by the self-alignment. The ion-implanting of the p-type impurities 54p is performed with the low dose amount and with the low acceleration energy with which the range distance Rp(p) reaches the position smaller than the thickness t of the transmission gate electrode 32 and shallower than the range distance Rp(n) of the n-type impurities from the substrate surface.

Figure 8C:
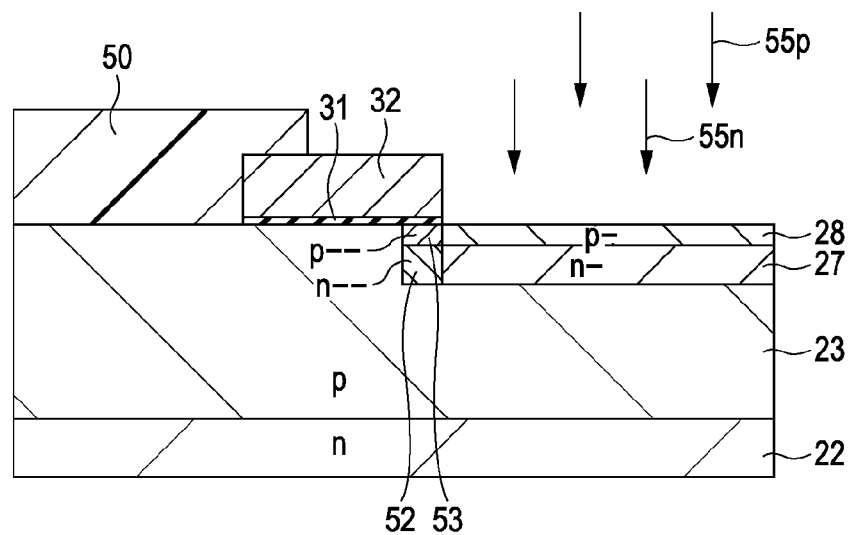

Subsequently, as shown in FIG. 8C, the n-type semiconductor area 27 is formed by performing the vertical ion-implanting of n-type impurities 55n, for example, arsenic, using the transmission gate electrode 32 as a mask by the self-alignment. Subsequently, the p-type semiconductor area 28 is formed on the n-type semiconductor area 27 by performing the vertical ion-implanting of p-type impurities 55p, for example, boron, using the transmission gate electrode 32 as a mask by the self-alignment. The acceleration energy of the p-type impurities 55p is set to be lower than the acceleration energy of the n-type impurities 55p, as described above. Since the n-type semiconductor area 27 and the p-type semiconductor area 28 are formed under the same ion-implanting condition by the two-time ion-implanting, the n-type semiconductor area 27 and the p-type semiconductor area 28 have the impurity concentration higher than the impurity concentration of the n-type semiconductor area 52 and the p-type semiconductor area 53 formed by one-time ion-implanting.

Here, the concentration of the n-type impurities 54n may be set to be the same as that of the n-type impurities 55n. In addition, the concentration of the p-type impurities 54p may be set to be the same as that of the p-type impurities 55p. Alternatively, the concentration of the n-type impurities 54n may be set to be different from that of the n-type impurities 55n. The concentration of the p-type impurities 54p may be set to be different from that of the p-type impurities 55p.

The resist mask 50 in FIG. 8B is used as the resist mask 50 in FIG. 8C. However, the resist mask 50 in FIG. 8B may be removed and a new resist mask 50 may be used in FIG. 8C.

Figure 9A:
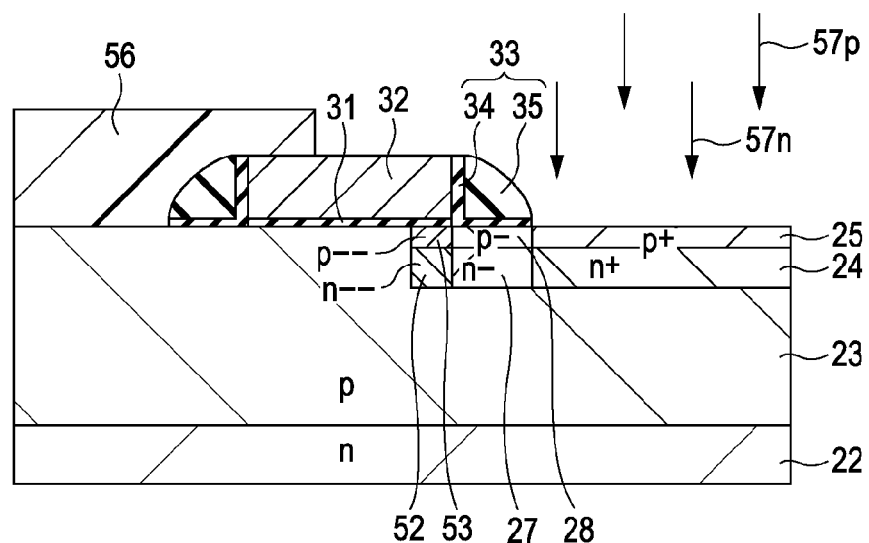
FIGS. 9A and 9B are diagrams (second manufacture diagrams) illustrating a method of manufacturing the solid-state imaging device according to the fourth embodiment.

Subsequently, as shown in FIG. 9A, the side wall 33 is formed of an insulating film on the side of the transmission gate electrode 32 by a general method. In this embodiment, the side wall 33 has the two-layered structure of the silicon oxide film 34 and the silicon nitride film 35. Subsequently, in the same way described above, a resist mask 56 is formed so as to extend to the part of the transmission gate electrode 32 other than the area where the photodiodes PD are formed. Using the side wall 33 and the transmission gate electrode 32 as a mask, the n-type semiconductor area 24 is formed by ion-implanting n-type impurities 57n under the same above-described ion-implanting condition as in FIG. 8C, for example, by the self-alignment.

Subsequently, using the side wall 33 and the transmission gate electrode 32 as a mask, the p-type semiconductor area 25 is formed by ion-implanting p-type impurities 57p vertically to the substrate under the same above-described ion-implanting condition as that in FIG. 8C by the self-alignment. Since the n-type semiconductor area 24 and the p-type semiconductor area 25 are formed by the three-time ion-implanting, the n-type semiconductor area 24 and the p-type semiconductor area 25 have the impurity concentration higher than the impurity concentration of the n-type semiconductor area 27 and the p-type semiconductor area 28 formed by the two-time ion-implanting. The n-type semiconductor area 24 serves as the main charge storage area.

Here, the concentration of the n-type impurities 55n may be set to be the same as that of the n-type impurities 57n. In addition, the concentration of the p-type impurities 55p may be set to be the same as that of the p-type impurities 57p. Alternatively, the concentration of the n-type impurities 55n may be set to be different from that of the n-type impurities 57n. The concentration of the p-type impurities 55p may be set to be different from that of the p-type impurities 57p.

In this way, the buried-type third photodiode PD3 including the low impurity concentration n-type semiconductor area 52 and the low impurity concentration p-type semiconductor area 53 is formed below a part of the transmission gate electrode 32. The buried-type second photodiode PD2 including the n-type semiconductor area 27 and the p-type semiconductor area 28 of the impurity concentration higher than that of the third photodiode PD3 is formed below the side wall 33. The buried-type first photodiode PD1 including the n-type semiconductor area 24 and the p-type semiconductor area 25 of the impurity concentration higher than that of the second photodiode PD2 is formed outside the end edge of the side wall 33 so as to continue with the second photodiode PD2. In this way, the photodiodes PD of a pixel is formed so as to include the three photodiodes PD1, PD2, and PD3.

Figure 9B:
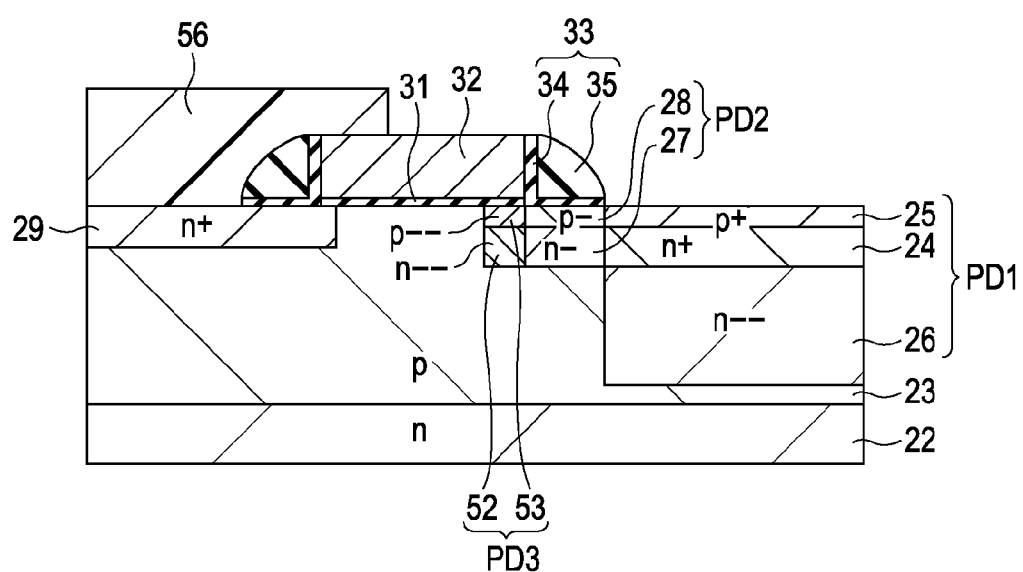

As shown in FIG. 9B, the n-type semiconductor area 29 serving as the floating diffusion (FD) is formed in the p-type semiconductor well area 23. In the first photodiode PD1, the low impurity concentration n-type semiconductor area 26 is formed by a necessary depth below the n-type semiconductor area 24 serving as the charge storage area so as to continue with the n-type semiconductor area 24. The n-type semiconductor area 26 is formed by the self-alignment by ion-implanting n-type impurities of a low dose amount using the side wall 33 and the transmission gate electrode 32 as a mask.

After the photodiodes PD and the plural pixel transistors are formed, the multi-layered wire layer, in which wires of plural layers are formed with the inter-layer insulating film interposed therebetween, is formed by a general method. The on-chip color filter and the on-chip micro lens are formed with the flattened film interposed therebetween. In this way, it is possible to obtain the solid-state imaging device 51 according to the fourth embodiment.

In the method of manufacturing the solid-state imaging device 51 according to this embodiment, the third photodiode PD3 and the second photodiode PD2 can be formed by the self-alignment by performing the tilt ion-implanting and the vertical ion-implanting, respectively, using the transmission gate electrode 32 as a mask. In addition, the first photodiode PD1 can be formed by the self-alignment by performing the vertical ion-implanting using the side wall 33 and the transmission gate electrode 32 as a mask. That is, the photodiodes PD of a pixel are formed such that the three photodiodes PD1, PD2, and PD3 of the different impurity concentrations are formed by the three-time ion-implanting of the impurities. By forming the photodiodes PD1, PD2, and PD3 of the different impurity concentrations, it is possible to manufacture the solid-state imaging device 51 capable of improving the reading characteristic and inhibiting the afterimage and the white dot.

Since the ion-implanting of the n-type impurities is performed by the range distance Rp(n) smaller than the thickness of the transmission gate electrode 32, the n-type impurities do not pass through the transmission gate electrode 32. By setting the acceleration energies of the first ion-implanting, the second implanting, and the third implanting so as to be the same as each other, the high impurity concentration n-type semiconductor area 24 serving as the charge storage area can be formed at the shallow position. Moreover, the p-type semiconductor area 25 also serving as the hole charge storage area can be formed on the n-type semiconductor area 24.

Accordingly, even when the pixel is miniaturized, the photodiodes PD are formed by the self-alignment and thus it is possible to manufacture the solid-state imaging device capable of inhibiting both the occurrence of an afterimage and the white dot.

When four or more photodiodes PD are formed so that the impurity concentrations become lower toward the transmission gate electrode 32, the side wall is formed and then the side wall may be subjected to tilt ion-implanting using the side wall as a mask. That is, the plural photodiodes of the different impurity concentrations can be formed by performing the ion-implanting in plural stages including the tilt ion-implanting and the vertical ion-implanting the ion-implanting plural times using the transmission gate electrode and/or the side wall of the transmission gate electrode.

6. Fifth Embodiment

Exemplary Configuration of Solid-State Imaging Device

Figure 10:
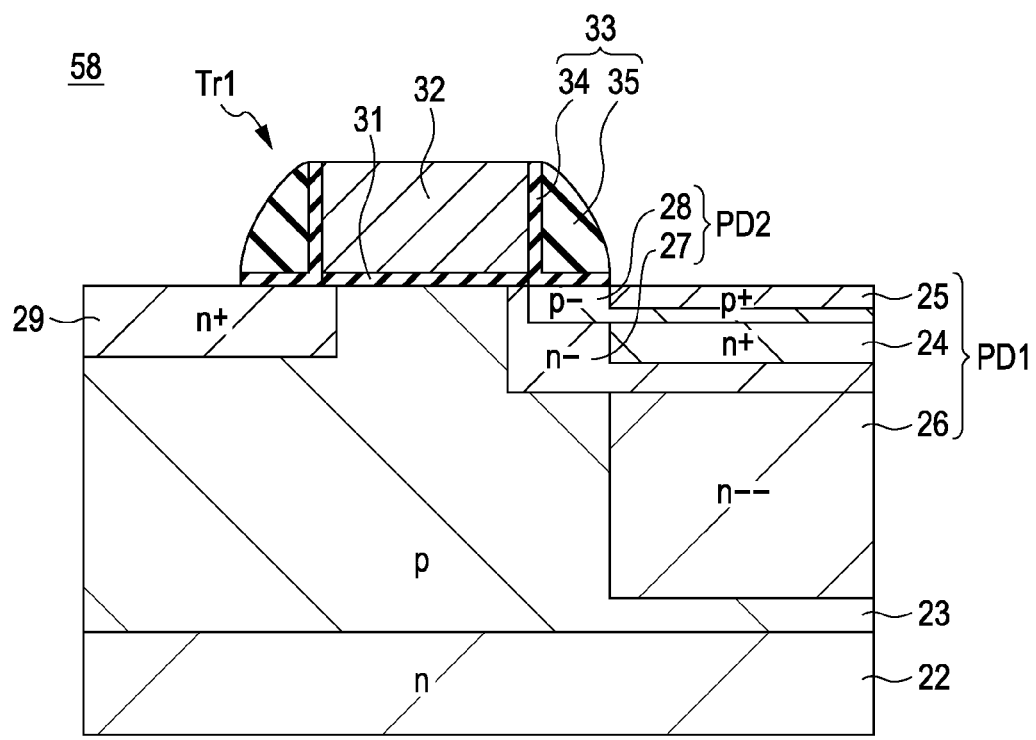
FIG. 10 is a schematic sectional view illustrating main elements of a solid-state imaging device according to a fifth embodiment of the invention.

FIG. 10 is a diagram illustrating a solid-state imaging device according to a fifth embodiment of the invention. The solid-state imaging device according to this embodiment is an MOS solid-state imaging device. FIG. 10 shows main elements including photodiodes serving as the photoelectric conversion element and a transmission transistor. As in the above-described first embodiment, a solid-state imaging device 58 according to the fifth embodiment includes, as photodiodes PD forming a pixel, a low impurity concentration second photodiode PD2 and a high impurity concentration first photodiode PD1. The second photodiode PD2 includes a low impurity concentration n-type semiconductor area 27 just below a part of the transmission gate electrode 32 and just below the side wall 33 and a low impurity concentration p-type semiconductor area 28 just below the side wall 33. The first photodiode PD1 includes a high impurity concentration n-type semiconductor area 24 serving as a charge storage area and formed outside the end edge of the side wall 33 and a high impurity concentration p-type semiconductor area 25 on the n-type semiconductor area 24. The first photodiode PD1 is formed such that a low impurity concentration n-type semiconductor area 26 is formed below the n-type semiconductor area 24 and to continue with the n-type semiconductor area 24.

In this embodiment, particularly, boron (B) is used as the p-type impurities in the ion-implanting using the transmission gate electrode 32 as a mask and indium (In) is used as the p-type impurities in the ion-implanting using the side wall 33 and the transmission gate electrode 32 as a mask. Indium (In) has a diffusion coefficient smaller than that of boron (B). By the ion-implanting of boron (B), the low impurity concentration p-type semiconductor area 28 is formed. In addition, by the second ion implanting of indium (In), the high impurity concentration p-type semiconductor area 25 is formed. By using indium (In), the p-type semiconductor area 25 can be formed on the substrate surface.

In the subsequent processes, by activation annealing of the source/drain of the pixel transistor, boron (B) diffuses, but indium (In) does not (rarely) diffuse. Accordingly, the p-type semiconductor area 25 formed by the second ion-implanting of indium (In) is present on the low impurity concentration p-type semiconductor area 28. On the contrary, the low impurity concentration p-type semiconductor area 28 formed in the first ion-implanting of boron (B) is present below the side wall 33 so as to extend between the high impurity p-type semiconductor area 25 and the high impurity concentration n-type semiconductor area 24.

Since the other configuration of the photodiodes PD and the transmission transistor Tr1 are the same as that of the first embodiment, the same reference numerals are given to the elements corresponding to those in FIG. 2 and the repeated description is omitted.

A method of manufacturing the solid-state imaging device 58 according to the fifth embodiment is performed in the same way as that of the manufacturing method described in the first embodiment.

In the solid-state imaging device 58 according to the fifth embodiment, as described above in the first embodiment, even when the pixel is further miniaturized and thus the thickness of the gate electrode of the pixel transistor and the thickness of the resist mask become thin, the photodiodes PD can be formed by the self-alignment.

As in the first embodiment, since the low impurity concentration second photodiode PD2 is formed close to the transmission gate electrode 32, the magnitude of an electric field in a lateral direction on the side of the transmission gate of the photodiode PD is relaxed. The n-type semiconductor area 24 serving as a main electric field storage area is formed at a shallow position of the substrate. Since the signal charges are more easily read, the reading voltage Vtg can be lowered. Moreover, since the p-type semiconductor area 28 of the second photodiode PD2 is formed in the vicinity of the interface below the side wall 33, the upwelling of the charges (electrons) from the interface may be inhibited and thus the occurrence of a white dot can be inhibited.

In this embodiment, in the first photodiode PD1, the high impurity concentration n-type semiconductor area 24 is distant from the high impurity concentration p-type semiconductor area 25, and the concentration gradient of the n-type semiconductor area and the p-type semiconductor area in the pn junction becomes gentle. That is, the magnitude of the electric field in the pn junction in a vertical direction of the substrate is lowered. Since the magnitude of the electric field in the pn junction is lowered, the occurrence of a white dot can be further inhibited. In the fifth embodiment, the afterimage is also inhibited with improvement in the reading characteristic and the occurrence of a white dot can be further inhibited. Accordingly, both the occurrence of an afterimage and the occurrence of a white dot can be inhibited. In this embodiment, the same advantages as those of the first embodiment can be obtained.

7. Sixth Embodiment

Exemplary Configuration of Solid-State Imaging Device

Figure 11:
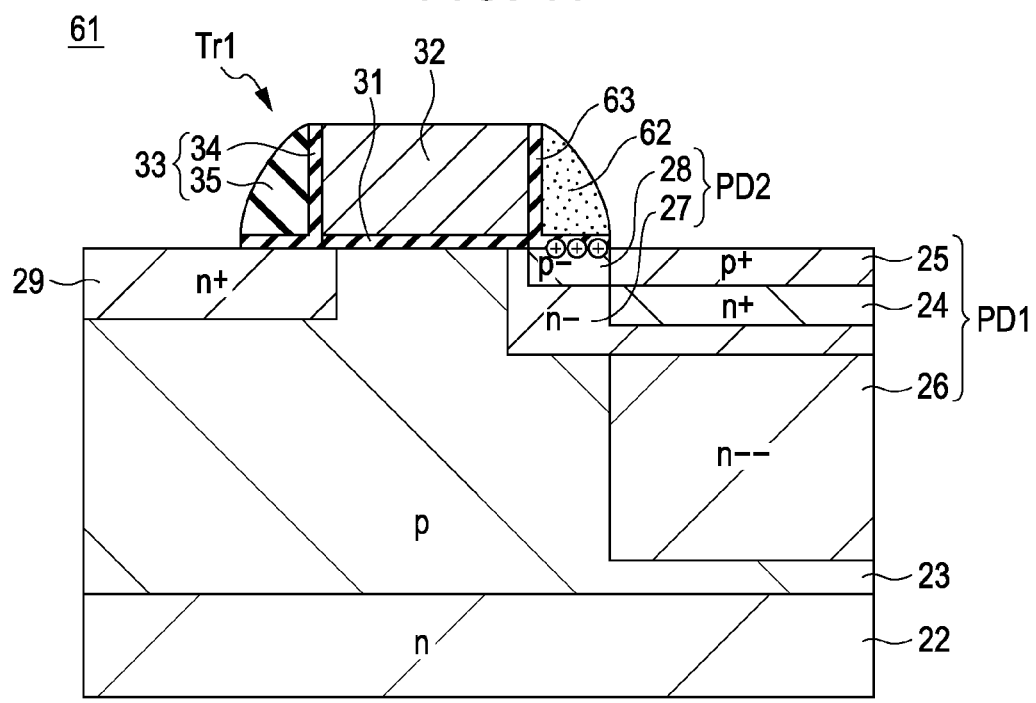
FIG. 11 is a schematic sectional view illustrating main elements of a solid-state imaging device according to a sixth embodiment of the invention.

FIG. 11 is a diagram illustrating a solid-state imaging device according to a sixth embodiment of the invention. The solid-state imaging device according to this embodiment is an MOS solid-state imaging device. FIG. 11 shows main elements including photodiodes serving as the photoelectric conversion element and a transmission transistor. As in the above-described first embodiment, a solid-state imaging device 61 according to the sixth embodiment includes, as photodiodes PD forming a pixel, a low impurity concentration second photodiode PD2 and a high impurity concentration first photodiode PD1. The second photodiode PD2 includes a low impurity concentration n-type semiconductor area 27 just below a part of the transmission gate electrode 32 and just below the side wall 33 and a low impurity concentration p-type semiconductor area 28 just below the side wall 33. The first photodiode PD1 includes a high impurity concentration n-type semiconductor area 24 serving as a charge storage area and formed outside the end edge of the side wall 33 and a high impurity concentration p-type semiconductor area 25 on the n-type semiconductor area 24. A low impurity concentration n-type semiconductor area 26 included in the first photodiode PD1 is formed below the n-type semiconductor area 24 so as to continue with the n-type semiconductor area 24.

The transmission transistor Tr1 includes a high impurity concentration n-type semiconductor area 29 serving as a floating diffusion (FD) and a transmission gate electrode 32 formed on the substrate between the n-type semiconductor area 29 and the second photodiode PD2 with a gate insulating film 31 interposed therebetween.

In this embodiment, a side wall 62 formed of a polysilicon film doped with impurities is formed on the side of the transmission gate electrode 32 close to the photodiodes PD with an insulating film 63, such as a silicon oxide film or a silicon nitride film, interposed therebetween. A side wall 33 formed of an insulating film is formed on the side of the transmission gate electrode 32 close to the floating diffusion (FD). In this embodiment, the transmission gate electrode 32 is formed of an n+ polysilicon film doped with n-type impurities. As the side wall 62 formed of a polysilicon film, a p+ polysilicon film doped with p-type impurities or an n+ polysilicon film doped with n-type impurities is formed.

A difference between the work functions of the n-type polysilicon and p-type polysilicon is about 1.1 V. In this configuration, when the side wall 62 is formed of the p+ polysilicon, a voltage of 0 V is applied to the transmission gate electrode 32 during a charge storage period and a gate voltage is simultaneously applied as the capacitive coupling to the side wall 62. Through the difference of the work functions, holes are induced just below the side wall 62 formed of the p+ polysilicon and thus hole-pinning is caused.

On the other hand, when the side wall 62 is formed of the n+ polysilicon holes are induced just below the side wall 62 formed of the n+ polysilicon with application of a negative voltage to the transmission gate electrode 32 during the charge storage period, and thus hole-pinning is caused. When a positive voltage is applied to the transmission gate electrode 32, the potential is modulated so as to have a gentle gradient just below the side wall 62 formed of the n+ polysilicon, thereby easily reading the signal charges.

Since the other configuration of the photodiodes PD and the transmission transistor Tr1 are the same as that of the first embodiment, the same reference numerals are given to the elements corresponding to those in FIG. 2 and the repeated description is omitted.

A method of manufacturing the solid-state imaging device 61 according to the sixth embodiment is performed in the same way as that of the manufacturing method described in the first embodiment.

In the solid-state imaging device 61 according to the sixth embodiment, as described above in the first embodiment, even when the pixel is further miniaturized and thus the thickness of the gate electrode of the pixel transistor and the thickness of the resist mask become thin, the photodiodes PD can be formed by the self-alignment. As in the first embodiment, since the low impurity concentration second photodiode PD2 is formed close to the transmission gate electrode 32, the magnitude of an electric field in a lateral direction on the side of the transmission gate of the photodiode PD is relaxed. The n-type semiconductor area 24 serving as a main electric field storage area is formed at a shallow position of the substrate. Since the signal charges are more easily read, the reading voltage Vtg can be lowered. Moreover, since the p-type semiconductor area 28 of the second photodiode PD2 is formed in the vicinity of the interface below the side wall 33, the upwelling of the charges (electrons) from the interface may be inhibited and thus the occurrence of a white dot can be inhibited.

In this embodiment, since the side wall 62 formed on the side of the transmission gate electrode 32 close to the photodiodes PD is formed of the polysilicon film doped with the necessary conductive type impurities, the hole-pinning is caused just below the side wall during the charge storage period. Accordingly, the upwelling of the charges below the side wall 62 can be further inhibited and the occurrence of a white dot can be further inhibited. In this way, in the sixth embodiment, the afterimage is also inhibited with improvement in the reading characteristic and the occurrence of a white dot can be further inhibited. Accordingly, both the occurrence of an afterimage and the occurrence of a white dot can be inhibited. In this embodiment, the same advantages as those of the first embodiment can be obtained.

8. Seventh Embodiment

Exemplary Configuration of Solid-State Imaging Device

Figure 12:
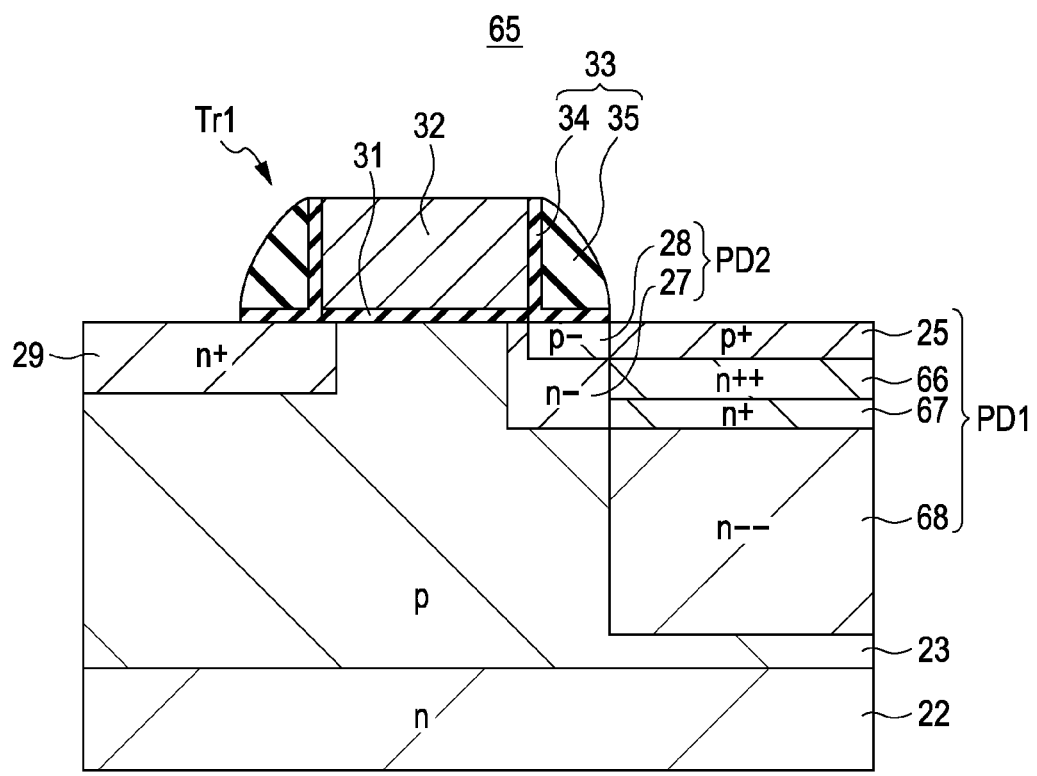
FIG. 12 is a schematic sectional view illustrating main elements of a solid-state imaging device according to a seventh embodiment of the invention.

FIG. 12 is a diagram illustrating a solid-state imaging device according to a seventh embodiment of the invention. The solid-state imaging device according to this embodiment is an MOS solid-state imaging device. FIG. 12 shows main elements including photodiodes serving as the photoelectric conversion element and a transmission transistor. As in the above-described first embodiment, a solid-state imaging device 65 according to the seventh embodiment includes, as photodiodes PD forming a pixel, a low impurity concentration second photodiode PD2 and a high impurity concentration first photodiode PD1. The second photodiode PD2 includes a low impurity concentration n-type semiconductor area 27 just below a part of the transmission gate electrode 32 and just below the side wall 33 and a low impurity concentration p-type semiconductor area 28 just below the side wall 33. The first photodiode PD1 includes a high impurity concentration n-type semiconductor area 66 serving as a charge storage area and formed outside the end edge of the side wall 33 and a high impurity concentration p-type semiconductor area 25 on the n-type semiconductor area 66.

The transmission transistor Tr1 includes a high impurity concentration n-type semiconductor area 29 serving as a floating diffusion (FD) and a transmission gate electrode 32 formed on the substrate between the n-type semiconductor area 29 and the second photodiode PD2 with a gate insulating film 31 interposed therebetween.

In this embodiment, the first photodiode PD1 is formed by the self-alignment. In particular, plural n-type semiconductor areas 66, 67, and 68 of which the impurity concentrations are different in the depth direction are formed by performing the ion-implanting of the n-type impurities in plural stages. In this embodiment, after the low impurity concentration n-type semiconductor area 27 and the low impurity concentration p-type semiconductor area 28 are formed, the n-type (n+) semiconductor area 67 of the high impurity concentration is formed by ion-implanting second n-type impurities to the n-type semiconductor area 27 using the side wall 33 and the transmission gate electrode 32 as a mask. Subsequently, the n-type (n++) semiconductor area 66, which is shallower than the n-type semiconductor area 67 and has an impurity concentration higher than that of the n-type semiconductor area 67, is formed by ion-implanting third n-type impurities using the same mask. The n-type semiconductor area 66 serves as a main charge storage area. Moreover, the low impurity concentration n-type (n−−) semiconductor area 68 is formed at a deep position using the same mask.

Since the other configuration of the photodiodes PD and the transmission transistor are the same as that of the first embodiment, the same reference numerals are given to the elements corresponding to those in FIG. 2 and the repeated description is omitted.

A method of manufacturing the solid-state imaging device 65 according to the seventh embodiment is performed in the same way as that of the manufacturing method described in the first embodiment.

In the solid-state imaging device 65 according to the seventh embodiment, as described above in the first embodiment, even when the pixel is further miniaturized and thus the thickness of the gate electrode of the pixel transistor and the thickness of the resist mask become thin, the photodiodes PD can be formed by the self-alignment. As in the first embodiment, since the low impurity concentration second photodiode PD2 is formed close to the transmission gate electrode 32, the magnitude of an electric field in a lateral direction on the side of the transmission gate of the photodiode PD is relaxed. The n-type semiconductor area 66 serving as a main electric field storage area is formed at a shallow position of the substrate. Since the signal charges are more easily read, the reading voltage Vtg can be lowered. Moreover, since the p-type semiconductor area 28 of the second photodiode PD2 is formed in the vicinity of the interface below the side wall 33, the upwelling of the charges (electrons) from the interface may be inhibited and thus the occurrence of a white dot can be inhibited. In this way, in the seventh embodiment, the after-image is also inhibited with improvement in the reading characteristic and the occurrence of a white dot can be further inhibited.

In this embodiment, in the first photodiode PD1, the impurity concentrations of the plural n-type semiconductor areas 66, 67, and 68 are lowered in the depth direction of the substrate. Accordingly, as for the n-type semiconductor areas 66, 67, and 68, the signal charges subjected to the photoelectric conversion are stored more effectively in the n-type semiconductor area 66 serving as the charge storage area by the potential gradient. In this embodiment, the same advantages as those of the first embodiment can be obtained.

In the solid-state imaging device according to the above-described embodiments, the electrons are used as the signal charges and the n-type and p-type are used as the first and second conductive types, respectively. However, the invention is applicable to a solid-state imaging device in which holes may be used as the signal charges. In this case, the conductive types of each substrate or semiconductor area may be conversely applied. That is, the p-type and the n-type may be used as the first and second conductive types, respectively.

9. Eighth Embodiment

Exemplary Configuration of Electronic Apparatus

The solid-state imaging device according to the embodiments of the invention may be applied to a camera with a solid-state imaging device, a camera-attached portable apparatus, and other electronic apparatuses with a solid-state imaging device. In particular, since a pixel is miniaturized, a camera with a small-sized solid-state imaging device can be manufactured.

Figure 13:
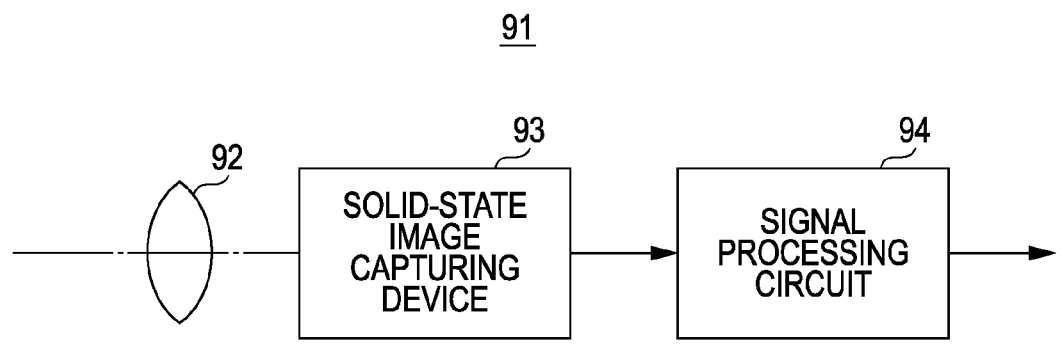
FIG. 13 is a schematic diagram illustrating the configuration of an electronic apparatus according to an eighth embodiment of the invention.

FIG. 13 is a diagram illustrating a camera which is an example of the electronic apparatus according to the embodiment of the invention. A camera 91 according to this embodiment includes an optical system (optical lens) 92, a solid-state imaging device 93, and a signal processing circuit 94. The solid-state imaging device 93 is applied as one solid-state imaging device according to the above-described embodiments. The optical system 92 forms the image of a face captured by the solid-state imaging device 93 from image light (incident light) from a subject. In this way, signal charges are stored during a certain period in the photodiodes serving as a photoelectric conversion unit of the solid-state imaging device 93. The signal processing circuit 94 performs various signal processing operations on the output signal of the solid-state imaging device 93. The camera 91 according to this embodiment includes a camera module formed by the optical system 92, the solid-state imaging device 93, and the signal processing circuit 94.

The camera of a representative exemplary cellular phone with a camera shown in FIG. 13 or a camera module may include the module having an imaging function and formed by the optical system 92, the solid-state imaging device 93, and the signal processing circuit 94. That is, the camera may be configured as a so-called imaging function module. An electronic apparatus with this imaging function module may be realized according to the embodiment of the invention.

In the electronic apparatus according to this embodiment, even when a pixel is miniaturized with high precision and the size of the solid-state imaging device is reduced, both the occurrence of an afterimage and the occurrence of a white dot can be inhibited. Accordingly, it is possible to realize the high-quality electronic apparatus with a high image quality and a high resolution.

The present application contains subject matter related to that disclosed in Japanese Priority Patent Application JP 2009-088095 filed in the Japan Patent Office on Mar. 31, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a pixel having a photodiode area;
a buried-type first photodiode formed by ion-implanting impurities using a first side wall of a transmission gate electrode as a mask, the first photodiode including a first area and a second area;
a buried-type second photodiode formed in the photodiode area by ion-implanting impurities using the transmission gate electrode as a mask;
a floating diffusion area formed by ion-implanting impurities using another side of the transmission gate electrode as a mask; and
a second side wall formed on the another side of the transmission gate electrode,
wherein,
a low impurity concentration of the second photodiode is closer to the transmission gate than that of a high impurity concentration of the first photodiode, the low impurity concentration being less than that of the high impurity concentration, and
a charge storage area is positioned below the first area and the second area of the first photodiode, the charge storage area having an end that is aligned with an end of the first sidewall.

2. The solid-state imaging device according to claim 1, wherein:
the second photodiode includes a first area and a second area,
the second area of the first photodiode is a first conductive type semiconductor area serving as a main charge storage area,
the first area of the first photodiode is a second conductive type semiconductor area that is closer to a semiconductor surface than that of the first conductive type semiconductor area of the first photodiode,
the second area of the second photodiode is a first conductive type semiconductor area, and
the first area of the second photodiode is a second conductive type semiconductor area that is closer to the semiconductor surface than that of the first conductive type semiconductor area of the second photodiode.

3. The solid-state imaging device according to claim 2, wherein:
the second conductive type semiconductor area of the second photodiode comprises a boron-implanted area, and
the second conductive type semiconductor area of the first photodiode comprises in an indium-implanted area.

4. The solid-state imaging device according to claim 2, wherein the first conductive type semiconductor areas include a plurality of high impurity concentration charge storage areas having different impurity concentrations that decrease in an increasing depth direction.

5. The solid-state imaging device according to claim 2, wherein at least portions of the first and second conductive type semiconductor areas of the first and second photodiodes are continuously formed.

6. The solid-state imaging device according to claim 1, wherein:
the second photodiode includes a first area and a second area,
each of the first areas has impurity concentrations different from each other,
each of the second areas has impurity concentrations different from each other,
each of the first areas is layered on a corresponding one of the second areas, and
the impurity concentrations of the second areas respectively decrease in a depth direction and another direction perpendicular to the depth direction.

7. A solid-state imaging device comprising:
a pixel having a photodiode area;
a first photodiode comprising a first conductivity type area and a second conductivity type area, the first photodiode being in the photodiode area; and
a second photodiode comprising a first conductivity type area and a second conductivity type area, the second photodiode being adjacent to the first photodiode in the photodiode area,
wherein,
the second photodiode is closer to a transmission gate electrode than the first photodiode,
the first conductivity type area of the second photodiode has an impurity concentration that is less than that of the first conductivity type area of the first photodiode,
the transmission gate electrode is between first sidewalls, and
a charge storage area is positioned below the first conductivity type area and the second conductivity type area of the first photodiode, the charge storage area having an end that is aligned with an end of one of the first sidewalls.

8. The solid-state imaging device of claim 7, further comprising:
a floating diffusion area on a side of the transmission gate electrode that is opposite to that of the first photodiode and the second photodiode.

9. The solid-state imaging device of claim 7, wherein:
the first conductivity type is p-type,
the second conductivity type is n-type, and
the charge storage area is n-type.

10. The solid-state imaging device of claim 7, wherein:
the charge storage area has an impurity concentration that is less than that of the second conductivity type area of the first photodiode.

* * * * *